(12) United States Patent  
Zhou et al.

(10) Patent No.: US 11,184,028 B2  
(45) Date of Patent: Nov. 23, 2021

(54) CODING METHOD, DECODING METHOD, APPARATUS, AND DEVICE

(71) Applicant: HUAWEI TECHNOLOGIES CO., LTD., Shenzhen (CN)

(72) Inventors: Yue Zhou, Hangzhou (CN); Huazi Zhang, Hangzhou (CN); Rong Li, Hangzhou (CN); Hejia Luo, Hangzhou (CN); Yunfei Qiao, Hangzhou (CN); Jun Wang, Hangzhou (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 1 day.

(21) Appl. No.: 16/569,745

(22) Filed: Sep. 13, 2019

(65) Prior Publication Data

US 2020/0007164 A1   Jan. 2, 2020

Related U.S. Application Data

(63) Continuation of application No. PCT/CN2018/078787, filed on Mar. 13, 2018.

(30) Foreign Application Priority Data

Mar. 13, 2017   (CN) .......................... 201710147552.9

(51) Int. Cl.
*H03M 13/00* (2006.01)
*H03M 13/13* (2006.01)
(Continued)

(52) U.S. Cl.
CPC ........... *H03M 13/13* (2013.01); *H03M 13/09* (2013.01); *H04L 1/0013* (2013.01); *H04L 1/0057* (2013.01)

(58) Field of Classification Search
None
See application file for complete search history.

(56) References Cited

U.S. PATENT DOCUMENTS

| 10,135,460 B2 * | 11/2018 | Ionita ...................... H03M 5/18 |
| 2013/0117344 A1 * | 5/2013 | Gross ................ H03M 13/1575 |
| | | 708/490 |

(Continued)

FOREIGN PATENT DOCUMENTS

| CN | 103220001 A | 7/2013 |
| CN | 105227189 A | 1/2016 |

(Continued)

OTHER PUBLICATIONS

Qualcomm Incorporated: "Comparison of Polar codes for control channel",3GPP Draft; R1-1702645, vol. RAN WG1 No. Athens, Greece; Feb. 13, 2017-Feb. 17, 2017, Feb. 12, 2017, XP051209794, 14 pages.

(Continued)

*Primary Examiner* — Mujtaba M Chaudry

(57) ABSTRACT

A coding method, a decoding method, an apparatus, and a device are provided. The method includes: coding, by a sending device, an information bit sequence to obtain a coded bit sequence, where the coded bit sequence includes an information bit, a frozen bit, a CRC check bit, and a frozen check bit; and a value of the frozen check bit and a value of the CRC check bit are obtained by using a same cyclic shift register; performing, by the sending device, polar coding and rate matching on the coded bit sequence to obtain a to-be-sent rate-matched sequence; and sending, by the sending device, the rate-matched sequence. According to the method, time and space for coding calculation and decoding calculation can be effectively reduced, and calculation complexity is reduced.

12 Claims, 19 Drawing Sheets

(51) Int. Cl.
*H03M 13/09* (2006.01)
*H04L 1/00* (2006.01)

(56) References Cited

U.S. PATENT DOCUMENTS

| | | | |
|---|---|---|---|
| 2014/0365842 A1 | 12/2014 | Li et al. | |
| 2015/0026543 A1* | 1/2015 | Li | H03M 13/45 714/776 |
| 2015/0092886 A1* | 4/2015 | Ionita | H03M 13/2792 375/298 |
| 2015/0293716 A1* | 10/2015 | Jiang | G06F 11/1012 711/154 |
| 2015/0295593 A1* | 10/2015 | Trifonov | H03M 13/13 714/776 |
| 2016/0164629 A1* | 6/2016 | Ahn | H04L 63/0428 714/776 |
| 2017/0126354 A1* | 5/2017 | Marsland | H04L 1/0009 |
| 2017/0149531 A1* | 5/2017 | Raza | H03M 13/37 |
| 2018/0198467 A1* | 7/2018 | Nammi | H04L 1/0002 |

FOREIGN PATENT DOCUMENTS

| | | |
|---|---|---|
| CN | 106230555 A | 12/2016 |
| CN | 106253913 A | 12/2016 |
| EP | 3079290 A1 | 10/2016 |
| EP | 3614592 A1 | 2/2020 |

OTHER PUBLICATIONS

Huawei et al., "Parity-Check polar and CRC-aided polar evaluation",3GPP TSG RAN WG1 Meeting #88 R1-1701701, Athens, Greece, Feb. 13-17, 2017,total 10 pages.
NTT DOCOMO: "Discussion on Polar codes design",3GPP Draft; R1-1700867, vol. RAN WG1 No. Spokane, USA Jan. 16, 2017 Jan. 20, 2017, Jan. 16, 2017, XP051208384, 8 pages.
Huawei et al., "Details of the Polar code design",3GPP TSG RAN WG1 Meeting #87 R1-1611254,Reno, USA, Nov. 10-14, 2016,total 15 pages.
Examination Report issued in Indian Application No. 201937038578, dated Mar. 16, 2021 total 6 pages.
Office Action issued in EP 18766823.1 dated Sep. 2, 2021, 7 pages.

* cited by examiner

CODING METHOD, DECODING METHOD, APPARATUS, AND DEVICE

CROSS-REFERENCE TO RELATED APPLICATIONS

This application is a continuation of International Application No. PCT/CN2018/078787, filed on Mar. 13, 2018, which claims priority to Chinese Patent Application No. 201710147552.9, filed on Mar. 13, 2017. The disclosures of the aforementioned patent applications are hereby incorporated by reference in their entireties.

TECHNICAL FIELD

This application relates to communications technologies, and in particular, to a coding method, a decoding method, an apparatus, and a device.

BACKGROUND

A polar code (Polar Codes) is a new type of channel coding proposed by E. Arikan in 2008. The polar code is designed based on channel polarization (Channel Polarization), and is a first constructive coding scheme that can be proven, by using a strict mathematical method, to reach a channel capacity. The polar code is a linear block code.

However, in the prior art, there is no specific solution of a more convenient coding manner in which a decoding end can perform error correction on a coded bit sequence.

SUMMARY

This application provides a coding method, a decoding method, an apparatus, and a device, so that a receive end can perform error correction on a coded bit sequence through coding by using a polar code.

A first aspect of this application provides a coding method, including:

obtaining, by a sending device, a to-be-encoded information bit sequence;

encoding, by the sending device, the to-be-encoded information bit sequence to obtain an encoded bit sequence, where the encoded bit sequence includes an information bit, a frozen bit, a cyclic redundancy check CRC bit, and a frozen check bit; and a value of the frozen check bit and a value of the CRC check bit;

performing, by the sending device, polar coding and rate matching on the coded bit sequence to obtain a to-be-sent rate-matched sequence; and sending, by the sending device, the rate-matched sequence.

In this solution, the sending device, namely, a coding side, may be a network device or a terminal. Correspondingly, a receiving device, namely, a decoding side, may be a terminal or a network device. This solution may be used for information exchange between a terminal and a network device, or may be used for information exchange between terminals. This is not limited in this solution.

In a sending process of coding, PC coding and CRC coding are uniformly performed by using a common CRC hardware resource, to simplify time complexity, space complexity, and calculation complexity of a coding algorithm, and implement parallel coding.

In a specific implementation, the cyclic shift register is a CRC register.

In a specific implementation, there is at least one frozen check bit, and a value of each frozen check bit is a value of a bit in a cyclic shift process of the cyclic shift register, or a value of each frozen check bit is a preset value.

In this solution, the value of the frozen check bit may be a value of a bit that is a most significant bit in the cyclic shift process of the cyclic shift register; or may be a value of any bit in the cyclic shift process of the cyclic shift register.

In a specific implementation, the coding, by the sending device, the to-be-encoded information bit includes:

sequentially assigning, by the sending device, values to the coded bit sequence based on a location of the information bit, a location of the frozen bit, a location of the CRC check bit, and a location of the frozen check bit, where an operation is as follows:

when a to-be-encoded bit is an information bit, updating a value of a bit in the cyclic shift register based on a value of the information bit; or when a to-be-encoded bit is a CRC check bit, assigning, to the CRC check bit, a CRC check value obtained from the cyclic shift register; or when a to-be-encoded bit is a frozen check bit, assigning, to the frozen check bit, a value corresponding to a bit in the cyclic shift feedback register; or when a to-be-encoded bit is a frozen bit, assigning a fixed value to the frozen bit.

In a specific implementation, when there is a CRC check bit before the frozen check bit, the method further includes:

updating the cyclic shift feedback register based on a value of the CRC check bit.

In a specific implementation, the updating a value of a bit in the cyclic shift register based on a value of the information bit includes:

updating values of bits in the cyclic shift register in order from a most significant bit to a least significant bit based on the information bit; or updating values of bits in the cyclic shift register in order from a least significant bit to a most significant bit based on the information bit.

In a specific implementation, when the to-be-encoded bit is the frozen check bit, the method further includes:

updating a value of a bit in the cyclic shift feedback register based on a value of the frozen check bit.

In a specific implementation, when the to-be-encoded bit is the frozen bit, the method further includes:

updating a value of a bit in the cyclic shift feedback register based on a value of the frozen bit.

In a specific implementation, when the to-be-encoded bit is the frozen check bit, the value of the bit in the cyclic shift process of the cyclic shift register is obtained from the cyclic shift register by using a multiplexer.

In a specific implementation, that when the to-be-encoded bit is the frozen check bit, a value is obtained from the cyclic shift feedback register, and is used as a value of the frozen check bit for value assignment includes:

reading a value from any bit in the cyclic shift feedback register, and using the value as the value of the frozen check bit for filling; or obtaining a value from the cyclic shift feedback register by using the multiplexer, and using the value as the value of the frozen check bit for filling.

In a specific implementation, that the value of the frozen check bit is obtained from the cyclic shift register by using the multiplexer includes:

starting to sequentially read a value from the least significant bit in the cyclic shift feedback register by using the multiplexer, and using the value as the value of the frozen check bit; or starting to sequentially read a value from the most significant bit in the cyclic shift feedback register by using the multiplexer, and using the value as the value of the frozen check bit; or starting to sequentially read a value from a data input bit in the cyclic shift feedback register by using the multiplexer, and using the value as the value of the frozen check bit; or starting to sequentially read a value from a preset bit in the cyclic shift feedback register by using the multiplexer, and using the value as the value of the frozen check bit; or obtaining a value from the cyclic shift feedback register in a pseudo-random form by using the multiplexer and an interleaved sequence, and using the value as the value of the frozen check bit.

A second aspect of this application provides a decoding method, including:

receiving, by a receiving device, a rate-matched sequence;

performing, by the receiving device, rate de-matching processing on the rate-matched sequence to obtain a to-be-decoded sequence; and decoding and checking, by the receiving device, the to-be-decoded sequence to obtain an information bit sequence, where the to-be-decoded sequence includes an information bit, a frozen bit, a CRC check bit, and a frozen check bit; and a check value of the frozen check bit and a check value of the CRC check bit are obtained by using a same cyclic shift register.

Corresponding to a coding side, the receiving device may be a network device or may be a terminal.

In this solution, CRC decoding and a PC check are uniformly performed by using a common CRC hardware resource, to simplify space complexity, time complexity, and calculation complexity of a decoding algorithm, and reduce a decoding latency.

In a specific implementation, the cyclic shift register is a CRC register.

In a specific implementation, there is at least one frozen check bit, and a check value of each frozen check bit is a value of a bit in a cyclic shift process of the cyclic shift register, or a value of each frozen check bit is a preset value.

In a specific implementation, the decoding and checking, by the receiving device, the to-be-decoded sequence to obtain an information bit sequence includes:

sequentially performing, by the receiving device, polar decoding and a check on the to-be-decoded sequence in order from a least significant bit to a most significant bit based on a location of the information bit, a location of the frozen bit, a location of the CRC check bit, and a location of the frozen check bit, where an operation is as follows:

when a to-be-decoded bit is an information bit, updating a value of a bit in the cyclic shift register based on a value that is of the information bit and that is obtained through decoding; or when a to-be-decoded bit is a CRC check bit, checking a CRC check value obtained through decoding and a check value that is of the CRC bit and that is obtained from the cyclic shift register; or when a to-be-decoded bit is a frozen check bit, checking a value that is of the frozen check bit and that is obtained through decoding and an obtained check value of the frozen check bit, where the check value of the frozen check bit is a value corresponding to a bit in the cyclic shift feedback register; or when a to-be-decoded bit is a frozen bit, obtaining a fixed frozen value through decoding.

In a specific implementation, when there is a CRC check bit before the frozen check bit, the method further includes:

updating the cyclic shift feedback register based on a value that is of the CRC check bit and that is obtained through decoding.

In a specific implementation, the updating a value of a bit in the cyclic shift register based on a value that is of the information bit and that is obtained through decoding includes:

updating values of bits in the cyclic shift register by using values that are of information bits and that are obtained through decoding in order from a least significant bit to a most significant bit.

In a specific implementation, when the to-be-decoded bit is a frozen check bit, the method further includes:

updating the cyclic shift feedback register based on the value that is of the frozen check bit and that is obtained through decoding.

In a specific implementation, when the to-be-decoded bit is a frozen bit, the method further includes:

updating the cyclic shift feedback register based on the fixed frozen value obtained through decoding.

In a specific implementation, when the to-be-decoded bit is a frozen check bit, the value of the bit in the cyclic shift process of the cyclic shift register is obtained from the cyclic shift register by using a multiplexer.

In a specific implementation, the checking a value that is of the frozen check bit and that is obtained through decoding and an obtained check value of the frozen check bit when a to-be-decoded bit is a frozen check bit includes:

checking the value that is of the frozen check bit and that is obtained through decoding and a check value that is of the frozen check bit and that is read from any bit in the cyclic shift feedback register; or checking the value that is of the frozen check bit and that is obtained through decoding and a check value that is of the frozen check bit and that is obtained from the cyclic shift feedback register by using the multiplexer.

In a specific implementation, that the check value of the frozen check bit is obtained from the cyclic shift register by using the multiplexer includes:

starting to sequentially read from the least significant bit in the cyclic shift feedback register by using the multiplexer, to obtain the check value of the frozen check bit; or starting to sequentially read from the most significant bit in the cyclic shift feedback register by using the multiplexer, to obtain the check value of the frozen check bit; or starting to sequentially read from a data input bit in the cyclic shift feedback register by using the multiplexer, to obtain the check value of the frozen check bit; or starting to sequentially read from a preset bit in the cyclic shift feedback register by using the multiplexer, to obtain the check value of the frozen check bit; or obtaining the check value of the frozen check bit from the cyclic shift feedback register in a pseudo-random form by using the multiplexer and an interleaved sequence.

A third aspect of this application provides a coding apparatus, including:

a processing module, configured to obtain a to-be-encoded information bit sequence, where the processing module is further configured to code the to-be-encoded information bit to obtain a coded bit sequence, where the coded bit sequence includes the information bit, a frozen bit, a cyclic redundancy check CRC check bit, and a frozen check bit; and a value of the frozen check bit and a value of the CRC check bit are obtained by using a same cyclic shift register; and the processing module is further configured to perform polar coding and rate matching on the coded bit sequence to obtain a to-be-sent rate-matched sequence; and a sending module, configured to send the rate-matched sequence.

In a specific implementation, the cyclic shift register is a CRC register.

In a specific implementation, there is at least one frozen check bit, and a value of each frozen check bit is a value of a bit in a cyclic shift process of the cyclic shift register, or a value of each frozen check bit is a preset value.

In a specific implementation, the processing module is specifically configured to:

sequentially assign values to the coded bit sequence based on a location of the information bit, a location of the frozen bit, a location of the CRC check bit, and a location of the frozen check bit, where an operation is as follows:

when a to-be-encoded bit is an information bit, updating a value of a bit in the cyclic shift register based on a value of the information bit; or when a to-be-encoded bit is a CRC check bit, assigning, to the CRC check bit, a CRC check value obtained from the cyclic shift register; or when a to-be-encoded bit is a frozen check bit, assigning, to the frozen check bit, a value corresponding to a bit in the cyclic shift feedback register; or when a to-be-encoded bit is a frozen bit, assigning a fixed value to the frozen bit.

In a specific implementation, when there is a CRC check bit before the frozen check bit, the processing module is further configured to update the cyclic shift feedback register based on a value of the CRC check bit.

In a specific implementation, the processing module is specifically configured to:

update values of bits in the cyclic shift register in order from a most significant bit to a least significant bit based on the information bit; or update values of bits in the cyclic shift register in order from a least significant bit to a most significant bit based on the information bit.

In a specific implementation, when the to-be-encoded bit is the frozen check bit, the processing module is further configured to update a value of a bit in the cyclic shift feedback register based on a value of the frozen check bit.

In a specific implementation, when the to-be-encoded bit is the frozen bit, the processing module is further configured to update a value of a bit in the cyclic shift feedback register based on a value of the frozen bit.

In a specific implementation, when the to-be-encoded bit is the frozen check bit, the value of the bit in the cyclic shift process of the cyclic shift register is obtained from the cyclic shift register by using a multiplexer.

A fourth aspect of this application provides a decoding apparatus, including:

a receiving module, configured to receive a rate-matched sequence; and a processing module, configured to perform rate dematching processing on the rate-matched sequence to obtain a to-be-decoded sequence, where the processing module is further configured to decode and check the to-be-decoded sequence to obtain an information bit sequence, where the to-be-decoded sequence includes an information bit, a frozen bit, a cyclic redundancy check CRC check bit, and a frozen check bit; and a check value of the frozen check bit and a check value of the CRC check bit are obtained by using a same cyclic shift register.

In a specific implementation, the cyclic shift register is a CRC register.

In a specific implementation, there is at least one frozen check bit, and a check value of each frozen check bit is a value of a bit in a cyclic shift process of the cyclic shift register, or a value of each frozen check bit is a preset value.

In a specific implementation, the processing module is specifically configured to:

sequentially perform polar decoding and a check on the to-be-decoded sequence in order from a least significant bit to a most significant bit based on a location of the information bit, a location of the frozen bit, a location of the CRC check bit, and a location of the frozen check bit, where an operation is as follows:

when a to-be-decoded bit is an information bit, updating a value of a bit in the cyclic shift register based on a value that is of the information bit and that is obtained through decoding; or when a to-be-decoded bit is a CRC check bit, checking a CRC check value obtained through decoding and a check value that is of the CRC bit and that is obtained from the cyclic shift register; or when a to-be-decoded bit is a frozen check bit, checking a value that is of the frozen check bit and that is obtained through decoding and an obtained check value of the frozen check bit, where the check value of the frozen check bit is a value corresponding to a bit in the cyclic shift feedback register; or when a to-be-decoded bit is a frozen bit, obtaining a fixed frozen value through decoding.

In a specific implementation, when there is a CRC check bit before the frozen check bit, the processing module is further configured to update the cyclic shift feedback register based on a value that is of the CRC check bit and that is obtained through decoding.

In a specific implementation, the processing module is specifically configured to update values of bits in the cyclic shift register by using values that are of information bits and that are obtained through decoding in order from a least significant bit to a most significant bit.

In a specific implementation, when the to-be-decoded bit is a frozen check bit, the processing module is further configured to update the cyclic shift feedback register based on the value that is of the frozen check bit and that is obtained through decoding.

In a specific implementation, when the to-be-decoded bit is a frozen bit, the processing module is further configured to update the cyclic shift feedback register based on the fixed frozen value obtained through decoding.

In a specific implementation, when the to-be-decoded bit is a frozen check bit, the value of the bit in the cyclic shift process of the cyclic shift register is obtained from the cyclic shift register by using a multiplexer.

It should be understood that, in an implementation of the foregoing coding apparatus or decoding apparatus, the processing module may be specifically implemented as a processor, the sending module may be implemented as a transmitter, and the receiving module may be implemented as a receiver.

A fifth aspect of this application provides a sending device, including a memory, a processor, a transmitter, and a computer program. The computer program is stored in the memory, and the processor runs the computer program to perform the coding method according to any implementation of the first aspect.

In a specific implementation of the sending device, there is at least one processor, configured to execute an executable instruction, namely, the computer program, stored in the memory, so that the sending device exchanges data with a receiving device by using a communications interface, to perform the coding method according to the first aspect or the implementations of the first aspect. Optionally, the memory may be alternatively integrated into the processor.

A sixth aspect of this application provides a receiving device, including a memory, a processor, a receiver, and a computer program. The computer program is stored in the memory, and the processor runs the computer program to perform the decoding method according to any implementation of the second aspect.

In a specific implementation of the receiving device, there is at least one processor, configured to execute an executable instruction, namely, the computer program, stored in the memory, so that the receiving device exchanges data with a sending device by using a communications interface, to perform the decoding method according to the second aspect or the implementations of the second aspect. Optionally, the memory may be alternatively integrated into the processor.

A seventh aspect of this application provides a storage medium, including a readable storage medium and a computer program. The computer program is used to implement the coding method according to any implementation of the first aspect.

An eighth aspect of this application provides a storage medium, including a readable storage medium and a computer program. The computer program is used to implement the decoding method according to any implementation of the second aspect.

A ninth aspect of this application provides a program product, where the program product includes a computer program (namely, an executable instruction), and the computer program is stored in a readable storage medium. At least one processor of a sending device may read the computer program from the readable storage medium, and the at least one processor executes the computer program, so that the sending device implements the coding method according to the first aspect or the implementations of the first aspect.

A tenth aspect of this application provides a program product, where the program product includes a computer program (namely, an executable instruction), and the computer program is stored in a readable storage medium. At least one processor of a receiving device may read the computer program from the readable storage medium, and the at least one processor executes the computer program, so that the receiving device implements the decoding method according to the second aspect or the implementations of the second aspect.

According to the coding method, the decoding method, the apparatus, and the device provided in this application, the sending device obtains the to-be-encoded information bit sequence; the sending device codes the to-be-encoded information bit to obtain the coded bit sequence, where the coded bit sequence includes the information bit, the frozen bit, the CRC check bit, and the frozen check bit; and the value of the frozen check bit and the value of the CRC check bit are obtained by using a same cyclic shift register; the sending device performs polar coding and rate matching on the coded bit sequence to obtain the to-be-sent rate-matched sequence; and the sending device sends the rate-matched sequence. In a coding process, the frozen check bit and a CRC are simultaneously coded by using a same cyclic shift register; and for corresponding decoding, decoding and a check may also be simultaneously performed by using a same cyclic shift register, to perform early path selection, thereby effectively reducing time and space for coding calculation and decoding calculation, and reducing calculation complexity.

DESCRIPTION OF EMBODIMENTS

The technical solutions of the embodiments of this application may be applied to a 5G communications system or a future communications system, and may also be applied to various other communications systems such as a global system for mobile communications (Global System for Mobile, GSM) system, a code division multiple access (CDMA, Code Division Multiple Access) system, a wideband code division multiple access (Wideband Code Division Multiple Access, WCDMA) system, a general packet radio service (General Packet Radio Service, GPRS) system, a long term evolution (Long Term Evolution, LTE) system, an LTE frequency division duplex (Frequency Division Duplex, FDD) system, an LTE time division duplex (Time Division Duplex, TDD) system, and a universal mobile telecommunications system (Universal Mobile Telecommunications System, UMTS).

Figure 1:
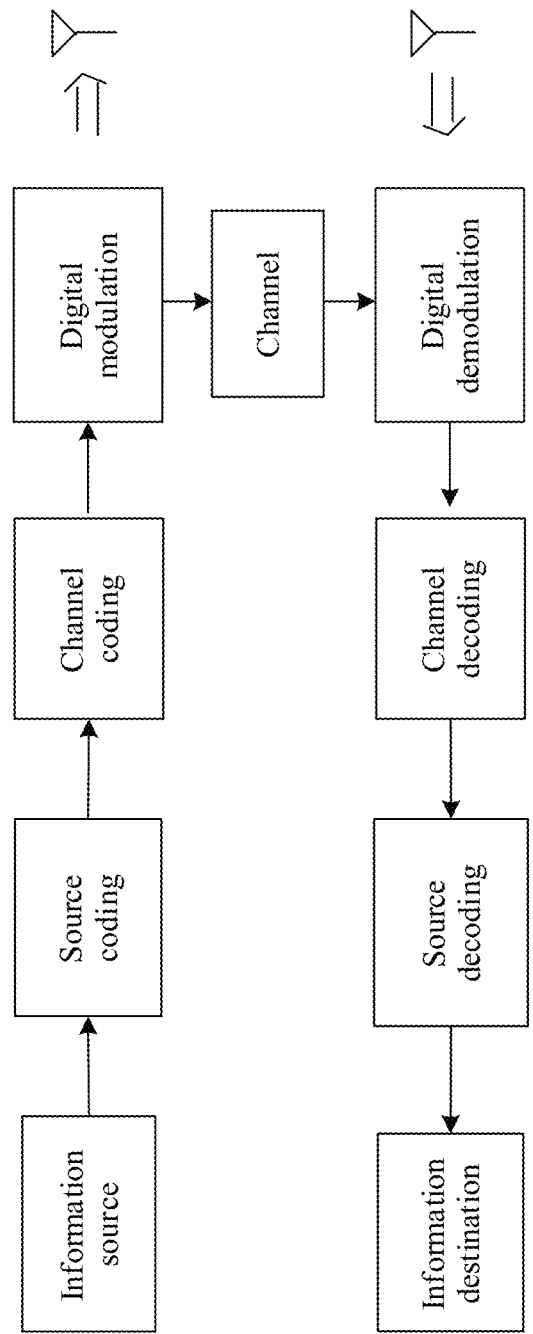
FIG. 1 is a basic schematic flowchart of commonly used wireless communication.

FIG. 1 is a basic schematic flowchart of commonly used wireless communication. As shown in FIG. 1, at a transmit end, information from an information source is transmitted after source coding, channel coding, and digital modulation are sequentially performed. At a receive end, the information is output from an information destination after digital demodulation, channel decoding, and source decoding are sequentially performed. A polar code may be used for channel coding. SC decoding, SCL decoding, or the like may be used for channel decoding. To improve performance of the polar code, many technologies such as a CA-polar code, a PC-polar code, and a CA+PC-polar code that are obtained through improvement based on the polar code are further proposed.

Figure 2A:
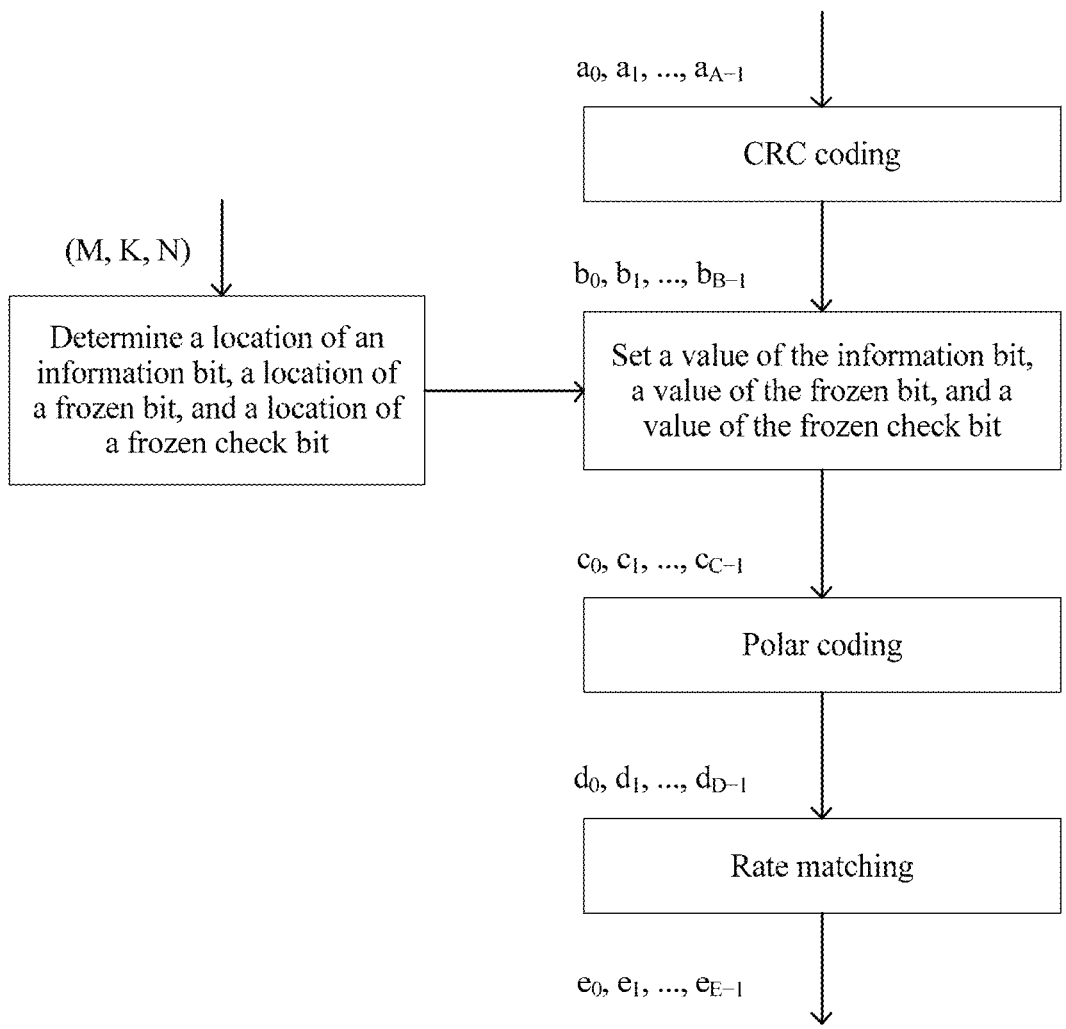
FIG. 2a is a schematic flowchart of commonly used coding performed by concatenating a CA-polar code and a PC-polar code.

FIG. 2a is a schematic flowchart of commonly used coding performed by concatenating a CA-polar code and a PC-polar code. As shown in FIG. 2a, the following steps are sequentially performed: (1) Perform concatenated cyclic redundancy check (Cyclic Redundancy Check, CRC) coding on to-be-encoded information bits $a_0, a_1, a_2, \ldots, a_{A-1}$ to obtain $b_0, b_1, \ldots, b_{B-1}$; (2) Perform PC coding, to be specific, set a value of an information bit, a value of a static frozen bit, and a value of a frozen check bit based on a determined location of the information bit, a determined location of the frozen bit, and a determined location of the frozen check bit, to generate a sequence $c_0, c_1, \ldots, c_{C-1}$; (3) Perform polar coding (namely, polar coding) to obtain a sequence $d_0, d_1, d_2, \ldots d_{D-1}$, and perform rate matching to obtain a sequence $e_0, e_1, e_2, \ldots, e_{E-1}$ for sending. A CRC coding matrix is uniquely determined by using the following parameters: a quantity of CRC check bits, a location of the CRC check bit, and a CRC check equation. The PC coding is determined by using the following parameters: the location of the frozen check bit and a check equation.

Implementation steps of a polar coding method in which a CRC is concatenated are as follows: A location of an information bit, a location of a frozen bit, and a location of a check bit are first determined. Then CRC coding is performed on to-be-encoded information bits. In other words, CRC calculation is performed (A represents an information bit length, and B represents a sum of the information bit length and a CRC check bit length). For the CRC calculation, an input is information bits $a_0, a_1, a_2, \ldots, a_{A-1}$, and generated check bits are $p_0, p_1, p_2, \ldots, p_{Kcrc-1}$. The CRC coding is performed in the following manner to obtain $b_0, b_1, \ldots, b_{B-1}$, where $b_k=a_k$ where $p_0,p_1,p_2,\ldots,p_{Kcrc-1}k=0,1,2,\ldots,A-1$.

$b_k=p_{k-A}$ where $p_0,p_1,p_2,\ldots,p_{Kcrc-1}k=A,A+1,A+2,\ldots,B-1$.

A value of the information bit, a value of the frozen bit, and a value of the frozen check bit are set in the CRC-coded sequence $b_0, b_1, \ldots, b_{B-1}$ obtained through CRC coding. Specifically, the value of the information bit, the value of the frozen bit, and the value of the frozen check bit may be set in the following manner, to obtain a sequence $c_0, c_1, \ldots, c_{C-1}$ (C represents a sequence length obtained after the value of the information bit, the value of the frozen bit, and the value of the frozen check bit are set. In other words, C is equal to a mother code length N), where $c_i=b_j$, where $i \in$ information bits;

$c_i=0$; where $i \in$ frozen bits; and $c_i=f(b_j)$, where $i \in$ frozen check bits, and $f(\cdot)$ represents a check equation.

Then Arikan polar coding is performed, where (D represents a sequence length obtained after Arikan polar coding, and is equal to N):

$[d_0,d_1,d_2,\ldots,d_{D-1}]=[c_0,c_1,c_2,\ldots,c_{C-1}] \cdot F_2^{\otimes n}$, and $n=\log_2 N$.

Finally, rate matching is performed. A sequence that is not to be transmitted is removed from the sequence $d_0, d_1, d_2, \ldots, d_{D-1}$, to obtain a to-be-transmitted sequence $e_0, e_1, e_2, \ldots, e_{E-1}$, where E represents a length of the rate-matched sequence, namely, a code length. After coding is completed, the obtained to-be-transmitted sequence may be sent to a receiving device.

However, in the coding method, the CRC coding and the PC coding (determining of the value of the frozen check bit and determining of the check equation) are separately performed, and there are the following several problems: (1) There is a sequence between operations, and this is inconvenient for parallel processing; (2) A check equation of each check bit and a value of the check bit need to be determined by a separate hardware unit; (3) Time complexity, space complexity, and calculation complexity of an algorithm are affected.

Figure 2B:
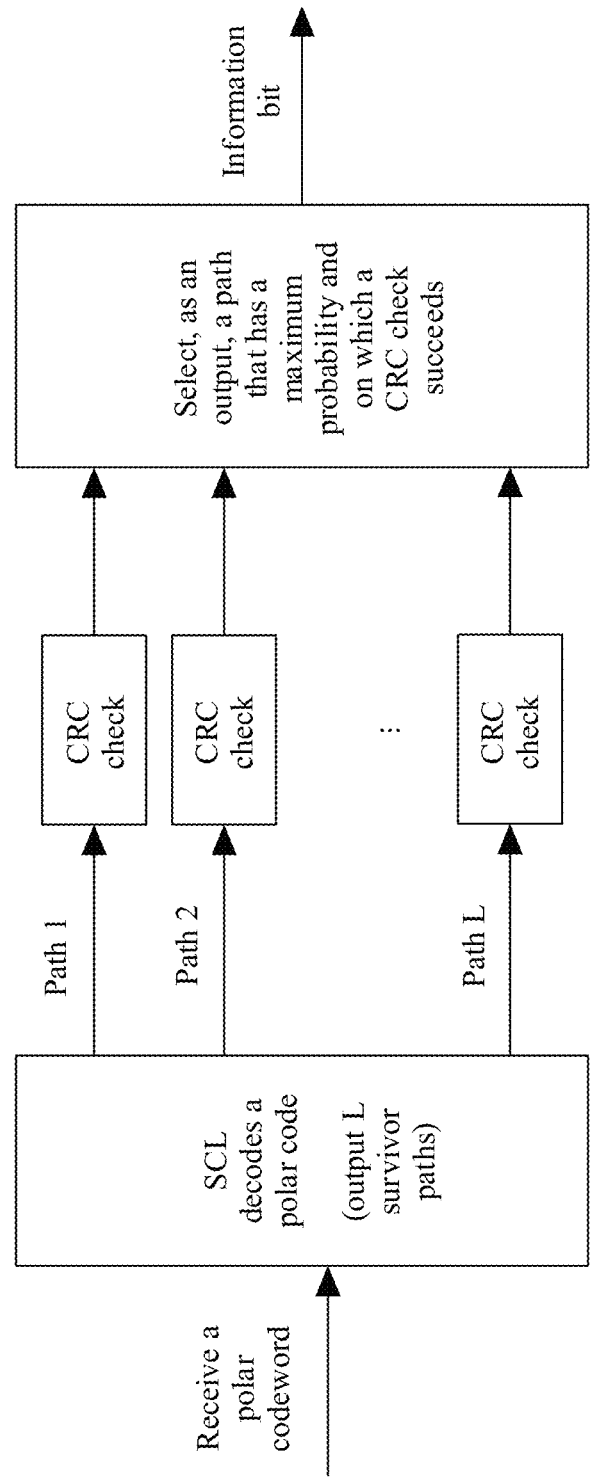
FIG. 2b is a schematic diagram of decoding of commonly used coding performed by concatenating a CA-polar code and a PC-polar code.

FIG. 2b is a schematic diagram of decoding of commonly used coding performed by concatenating a CA-polar code and a PC-polar code. As shown in FIG. 2b, an SCL first decodes a polar code and outputs L survivor paths (L is a parameter); then a CRC check is performed on the survivor paths; and a path on which the CRC succeeds is selected as a decoding output. If there is no path on which the CRC check succeeds, the decoding fails, and a path having a maximum probability may be selected as an output; and if there is more than one path on which the CRC check succeeds, a path having a maximum probability is selected from the path as an output. This decoding method has the following several problems: (1) A FAR false alarm rate problem: Because the CRC is introduced to aid in decoding, the CRC needs to be repeated L times to check the paths. In this case, for decoding concatenated with a J-bit CRC, a false alarm rate rises from $FAR=2^{-J}$ of an SC decoder to $FAR=L \times 2^{-J}$ of an SCL decoder. It can be learned that when a CRC-aided SCL decoder is used, the CRC needs to be used in a final phase of the decoding to check each path to aid in the decoding, and the false alarm rate is increased; (2) In addition, SCL decoding and the CRC check are separately performed, and early path selection and early path termination cannot be implemented.

In conclusion, this application provides a technical solution for resolving the problems in coding and decoding. The coding method and the decoding method provided in this application are described below in detail with reference to the accompanying drawings.

Figure 3:
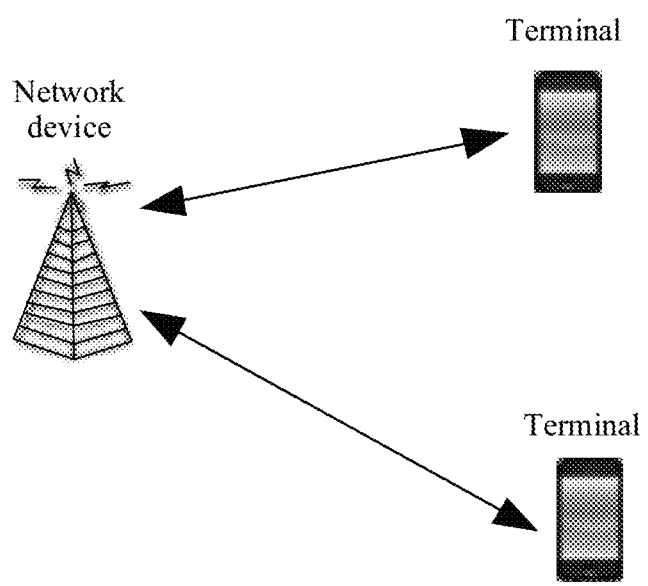
FIG. 3 is a schematic diagram of an application system of a coding method and a decoding method according to this application.

FIG. 3 is a schematic diagram of an application system of a coding method and a decoding method according to this application. As shown in FIG. 3, this solution is applied to an information exchange process between a network device and a terminal. A coding side may be the network device or the terminal; and correspondingly, a decoding side may be the terminal or the network device. Optionally, this solution may alternatively be applied to an information exchange process between terminals. This is not limited in this solution.

Figure 4:
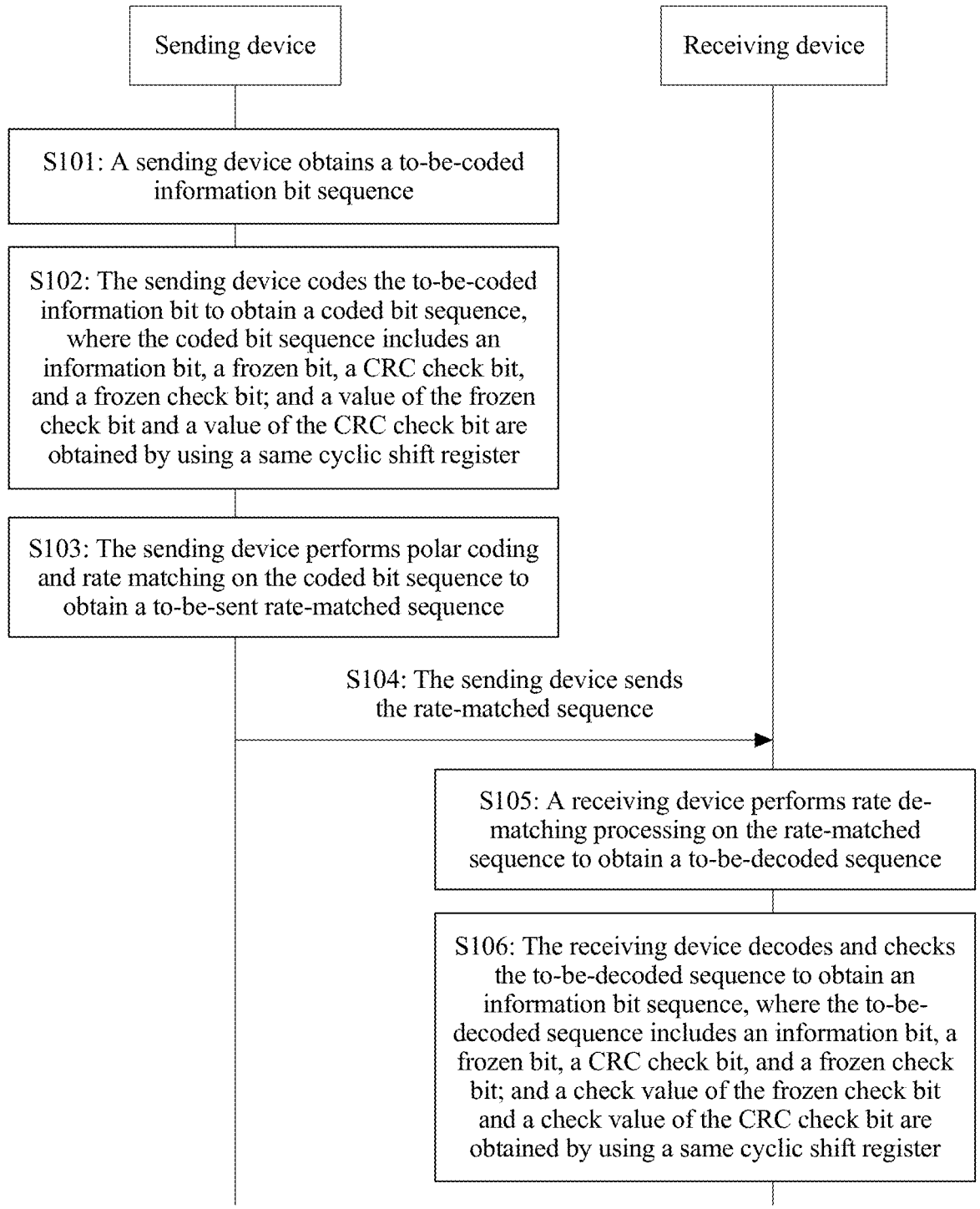
FIG. 4 is an interaction flowchart of a coding method and a decoding method according to this application.

FIG. 4 is an interaction flowchart of a coding method and a decoding method according to this application. As shown in FIG. 4, specific implementation steps of the coding method and the decoding method are as follows:

S101: A sending device obtains a to-be-encoded information bit sequence.

S102: The sending device codes the to-be-encoded information bit to obtain a coded bit sequence, where the coded bit sequence includes an information bit, a frozen bit, a CRC check bit, and a frozen check bit; and a value of the frozen check bit and a value of the CRC check bit are obtained by using a same cyclic shift register.

In the foregoing step, when the sending device needs to send information, the sending device codes the obtained information bit sequence in same hardware (cyclic shift register), to be specific, assigns values to the CRC check bit, the frozen check bit, and the frozen bit when coding the information bit, to obtain the coded sequence.

S103: The sending device performs polar coding and rate matching on the coded bit sequence to obtain a to-be-sent rate-matched sequence.

S104: The sending device sends the rate-matched sequence.

In the foregoing step, the sending device sends the rate-matched sequence that is obtained after performing polar coding and rate matching on the coded sequence that is obtained after assigning the values to the CRC check bit, the frozen check bit, and the frozen bit.

A receiving device receives the rate-matched sequence sent by the sending device.

S105: The receiving device performs rate de-matching processing on the rate-matched sequence to obtain a to-be-decoded sequence.

S106: The receiving device decodes and checks the to-be-decoded sequence to obtain an information bit sequence, where the to-be-decoded sequence includes an information bit, a frozen bit, a CRC check bit, and a frozen check bit; and a check value of the frozen check bit and a check value of the CRC check bit are obtained by using a same cyclic shift register.

In the foregoing step, the receiving device performs polar decoding on the to-be-decoded sequence obtained after rate de-matching processing. In addition, when decoding the CRC check bit and the frozen check bit, the receiving device may check, based on a location of the frozen check bit and a location of the CRC check bit, the check value of the frozen check bit and the check value of the CRC check bit that are obtained by using the same cyclic shift register, to complete early selection of a decoding path without performing checks one by one after decoding.

According to the coding method and the decoding method provided in this embodiment, in a coding process, frozen check bit coding and CRC coding are performed simultaneously by using a same cyclic shift register; and for corresponding decoding, decoding and a check may also be simultaneously performed by using a same cyclic shift register, to perform early path selection, thereby effectively reducing time and space for coding calculation and decoding calculation, and reducing calculation complexity.

Figure 5:
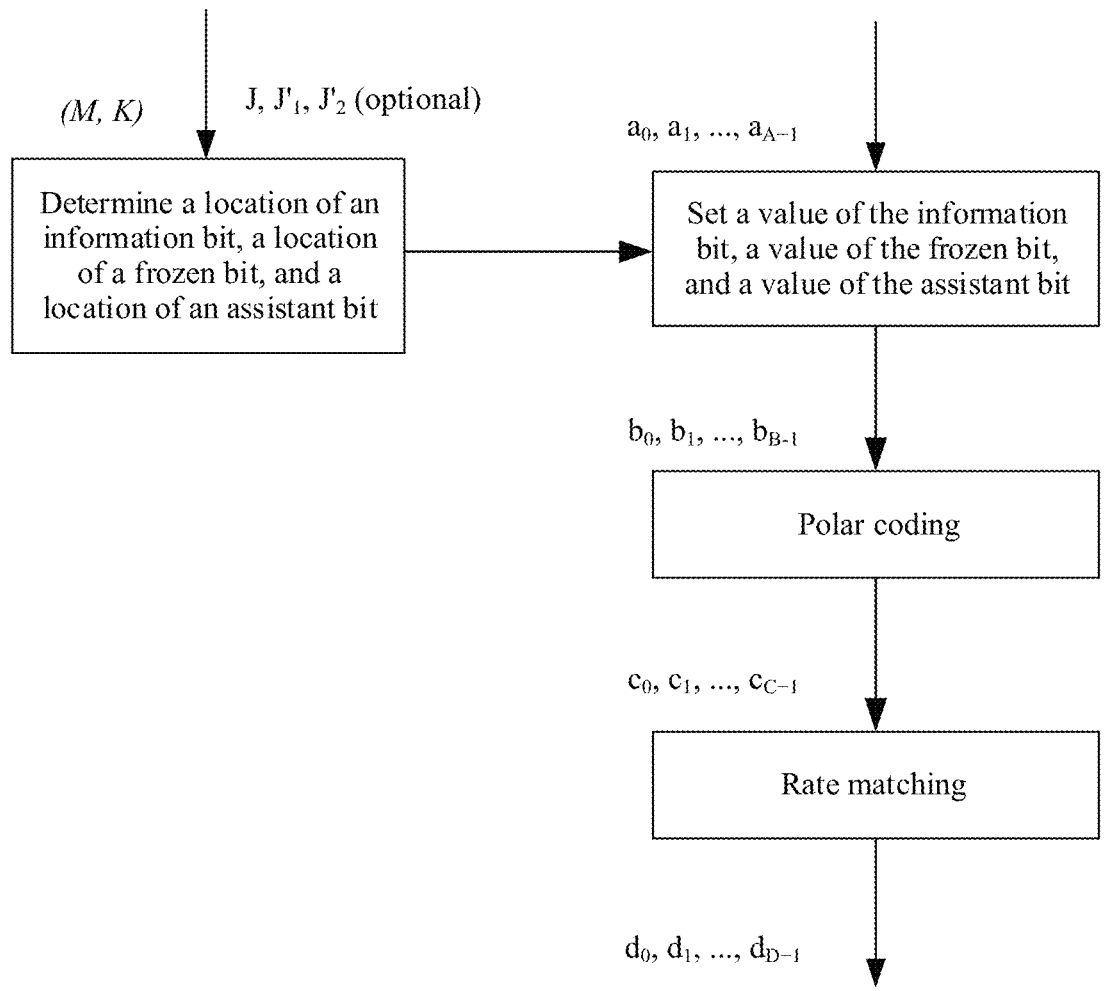
FIG. 5 is a specific schematic flowchart of a coding method according to this application.

FIG. 5 is a specific schematic flowchart of a coding method according to this application. As shown in FIG. 5, a coding side device, namely, a sending device, may perform coding by using the following several steps.

Step 1: Determine a location.

The coding side device determines a location of an information bit, a location of a frozen bit, and a location of an assistant bit based on an obtained to-be-encoded information length K (namely, a length of a to-be-encoded information bit sequence), a coded information length M, and an assistant bit length. Assistant bits include a CRC bit and a PC bit. A J-bit CRC used for error detection and error correction, a $J'_1$-bit CRC only used for error correction, and a $J'_2$-bit PC only used for error correction may be selected based on an actual application situation.

If the to-be-encoded information length is fixed, the location of the information bit, the location of the frozen bit, and the location of the assistant bit may also be relatively fixed. In this case, step 1 becomes optional. In other words, the coding side device may not perform step 1.

Step 2: Set a value of an information bit, a value of a frozen bit, and a value of an assistant bit.

A value of an information bit, a value of a frozen bit, and a value of an assistant bit in a to-be-encoded information bit sequence $a_0, a_1, \ldots, a_{A-1}$ are set based on a determined location of the information bit, a determined location of the frozen bit, and a determined location of the assistant bit, to obtain a sequence $b_0, b_1, \ldots, b_{B-1}$. The sequence $b_0, b_1, \ldots, b_{B-1}$ in this solution is different from the bits in FIG. 2a. The sequence $b_0, b_1, \ldots, b_{B-1}$ in this solution is a sequence obtained after CRC coding and PC coding. Specifically, coding may be performed in the following manner:

$$b_i = a_j; \text{ where } i \in \text{information bits; and}$$

$$b_i = 0; \text{ where } i \in \text{frozen bits.}$$

Assistant bits (such as a CRC bit or a frozen check bit) are uniformly set by using a unified hardware resource (for example, a cyclic shift feedback register). An implementation form of the hardware resource also determines a check equation of the frozen check bit.

Step 3: Perform polar coding (polar coding) on a sequence $b_0, b_1, \ldots, b_{B-1}$ obtained after assisted coding, to obtain a sequence $c_0, c_1, \ldots, c_{C-1}$.

Step 4: Perform rate matching on the polar-coded sequence $c_0, c_1, \ldots, c_{C-1}$, to obtain a sequence $d_0, d_1, \ldots, d_{D-1}$.

After performing rate matching, the coding side device may send the obtained rate-matched sequence to a receiving device, namely, a decoding side device for decoding.

Figure 6:
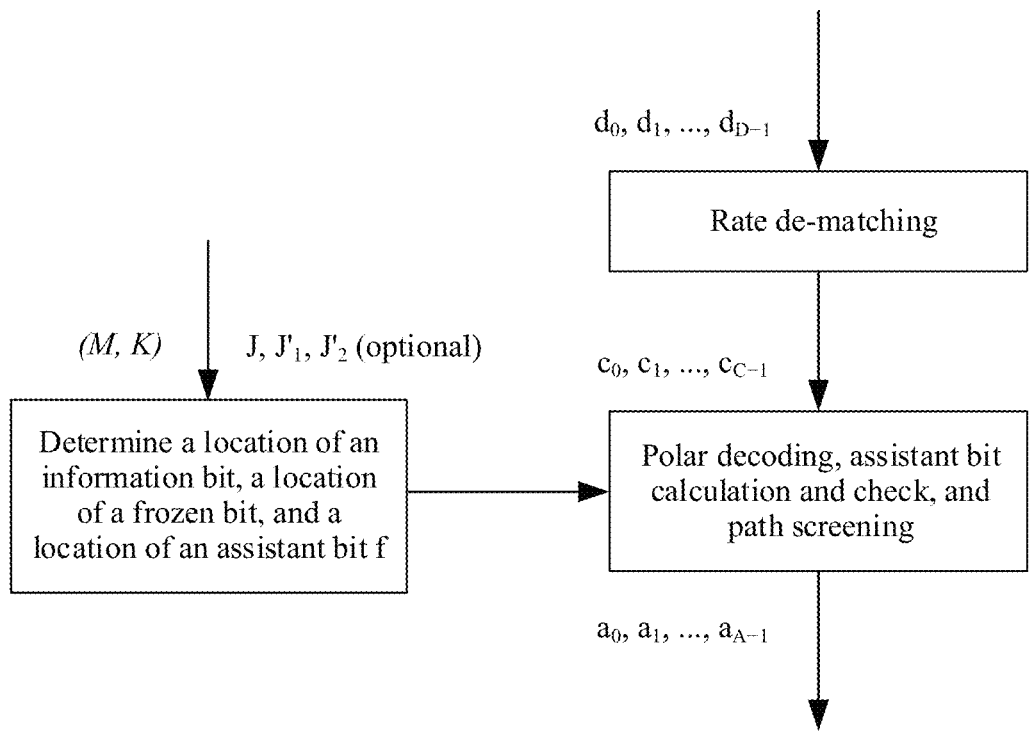
FIG. 6 is a specific schematic flowchart of a decoding method according to this application.

FIG. 6 is a specific schematic flowchart of a decoding method according to this application. As shown in FIG. 6, a decoding side device, namely, a receiving device, may perform decoding by using the following several steps.

Step 1: Perform rate de-matching.

Rate de-matching processing is performed based on a sequence $d_0, d_1, \ldots, d_{D-1}$ and a puncturing scheme, to recover a sequence $c_0, c_1, \ldots, c_{C-1}. c_0, c_1, c_2, \ldots, c_{C-2}$ Step 2: Determine a location.

A location of an information bit, a location of a frozen bit, and a location of an assistant bit are determined. Assistant bits include a CRC bit and a PC bit. This step may be performed before a rate-matched sequence is received, or may be performed after a rate-matched sequence is received. This is not limited in this solution.

Step 3: Perform decoding.

Consistent with a coding side, when performing bit-by-bit decoding by using polar decoding (polar decoding) based on the determined location of the information bit, the determined location of the frozen bit, and the determined location of the assistant bit, the decoding side device decodes and checks the assistant bit by using a unified hardware resource (for example, a cyclic shift feedback register), to implement early selection, early termination, and final screening of a decoding path, and obtain an information bit sequence $a_0, a_1, \ldots, a_{A-1}$.

In the coding method and the decoding method shown in FIG. 5 and FIG. 6, PC coding and CRC coding are uniformly performed by using a common CRC hardware resource, to simplify time complexity, space complexity, and calculation complexity of a coding algorithm, and implement parallel coding. CRC decoding and a PC check are uniformly performed by using a common CRC hardware resource, to simplify space complexity, time complexity, and calculation complexity of a decoding algorithm and reduce a decoding latency.

Based on the coding method and the decoding method shown in FIG. 4 to FIG. 6, a specific implementation of a coding process and a specific implementation of a decoding process in the solutions are described below by using a specific implementation as an example.

Step S102 shown in FIG. 4 may be specifically implemented as follows: The sending device sequentially assigns values to the coded bit sequence based on a location of the information bit, a location of the frozen bit, a location of the CRC check bit, and a location of the frozen check bit. An operation is as follows:

When a to-be-encoded bit is an information bit, a value of a bit in the cyclic shift register is updated based on a value of the information bit. The cyclic shift register is a shift register corresponding to a predetermined polynomial. The polynomial is preconfigured in the sending device and the receiving device, or the polynomial is a polynomial determined by the sending device and the receiving device based on an agreement. A same polynomial is used for coding and decoding. The polynomial is used to represent an operation structure of a cyclic shift feedback register that performs an assistant bit operation.

When a to-be-encoded bit is a CRC check bit, a CRC check value obtained from the cyclic shift register is assigned to the CRC check bit.

When a to-be-encoded bit is a frozen check bit, a value corresponding to a bit in the cyclic shift feedback register is assigned to the frozen check bit.

When a to-be-encoded bit is a frozen bit, a fixed value is assigned to the frozen bit.

In this solution, it should be understood that the cyclic shift feedback register is any one of a plurality of cyclic shift feedback registers (also referred to as cyclic feedback shift registers) corresponding to the polynomial. For example, the cyclic shift feedback register may be a register that performs calculation by using only an input, or may be a register that performs calculation by using both an input and an output, or may be a register that performs calculation by using an output. However, in specific use, once a cyclic shift feedback register corresponding to the polynomial is selected, the cyclic shift feedback register is unique in a processing procedure. The same is true for the receiving device side. The cyclic shift feedback register needs to be consistent with a cyclic shift feedback register used by the receiving device.

Optionally, the cyclic shift feedback register is a CRC register.

Optionally, there is at least one frozen check bit, and a value of each frozen check bit is a value of a bit in a cyclic shift process of the cyclic shift register, or a value of each frozen check bit is a preset value.

Optionally, in the foregoing coding process, when the to-be-encoded bit is the CRC check bit, and the CRC check bit is interleaved with the frozen check bit, in other words, there is one or more CRC check bits before the frozen check bit, the sending device further updates the cyclic shift feedback register based on a value that is of the CRC check bit and that is obtained through coding, in other words, uses the value of the CRC check bit as an input into the cyclic shift feedback register for updating.

Optionally, that when the to-be-encoded bit is the information bit, the value of the bit in the cyclic shift register is updated based on the value of the information bit is specifically implemented as follows: Information values start to be filled into the information bit sequence from a most significant bit or a least significant bit, and the cyclic shift feedback register is updated based on the information values. This is specifically implemented in the following two manners:

Implementation 1: Update values of bits in the cyclic shift register in order from the most significant bit to the least significant bit based on the information bit. This means that the information bit sequence starts to be coded from the most significant bit, and when each information value is input, the cyclic shift feedback register shifts from the least significant bit to the most significant bit.

Implementation 2: Update values of bits in the cyclic shift register in order from the least significant bit to the most significant bit based on the information bit. This means that the information bit sequence starts to be coded from the least significant bit, and when each information value is input, the cyclic shift feedback register shifts from the most significant bit to the least significant bit.

Optionally, in the foregoing coding process, when the to-be-encoded bit is the frozen check bit, the sending device may further update a value of a bit in the cyclic shift feedback register based on a value of the frozen check bit.

Based on any one of the foregoing solutions, optionally, in the foregoing coding process, when the to-be-encoded bit is the frozen bit, the sending device may further update a value of a bit in the cyclic shift feedback register based on a value of the frozen bit.

Optionally, in the foregoing coding process, when the to-be-encoded bit is the frozen check bit, a value is obtained from the cyclic shift feedback register and is used as a value of the frozen check bit, and there are at least the following several implementations:

Manner 1: The sending device reads a value from any bit in the cyclic shift feedback register, and uses the value as the value of the frozen check bit, in other words, does not limit a specific bit in the cyclic shift feedback register. In the coding process, the sending device may read a value from any bit that is in the cyclic shift feedback register and that is pre-agreed on with the receiving device, and use the value as the value of the frozen check bit, provided that the values are consistent on the sending device side and the receiving device side.

Manner 2: The sending device may obtain a value from the cyclic shift feedback register by using a multiplexer, and use the value as the value of the frozen check bit.

Manner 3: The sending device directly uses a fixed value as the value of the frozen check bit for filling.

It can be learned from the foregoing several implementations that there is at least one frozen check bit, and the value of each frozen check bit is the value of the bit in the cyclic shift process of the cyclic shift register, or the value of each frozen check bit is a preset value, for example, 0 or 1. Alternatively, the value of the bit in the cyclic shift process of the cyclic shift register is obtained from the cyclic shift register by using the multiplexer.

In a specific implementation of this solution, the sending device starts to sequentially read a value from the least significant bit in the cyclic shift feedback register by using the multiplexer, and uses the value as the value of the frozen check bit; or starts to sequentially read a value from the most significant bit in the cyclic shift feedback register by using the multiplexer, and uses the value as the value of the frozen check bit; or starts to sequentially read a value from a data input bit in the cyclic shift feedback register by using the multiplexer, and uses the value as the value of the frozen check bit; or starts to sequentially read a value from a preset bit in the cyclic shift feedback register by using the multiplexer, and uses the value as the value of the frozen check bit; or obtains a value from the cyclic shift feedback register in a pseudo-random form by using the multiplexer and an interleaved sequence, and uses the value as the value of the frozen check bit. Specifically, which manner is to be used may be preconfigured or pre-agreed on.

Step S106 shown in FIG. 4 may be specifically implemented as follows: The receiving device sequentially performs polar decoding and a check on the to-be-decoded sequence in order from a least significant bit to a most significant bit based on a location of the information bit, a location of the frozen bit, a location of the CRC check bit, and a location of the frozen check bit. An operation is as follows:

When a to-be-decoded bit is an information bit, a value of a bit in the cyclic shift register is updated based on a value that is of the information bit and that is obtained through decoding. Similar to a coding side, a polynomial is a polynomial preconfigured in the sending device and the receiving device, or a polynomial determined by the sending device and the receiving device based on an agreement. A same polynomial is used for coding and decoding, and an operation structure of a cyclic shift feedback register that performs an assistant bit operation may be represented by using a polynomial.

When a to-be-decoded bit is a CRC check bit, a CRC check value obtained through decoding and a check value that is of the CRC bit and that is obtained from the cyclic shift register are checked.

When a to-be-decoded bit is a frozen check bit, a value that is of the frozen check bit and that is obtained through decoding and an obtained check value of the frozen check bit are checked, and the check value of the frozen check bit is a value corresponding to a bit in the cyclic shift feedback register.

When a to-be-decoded bit is a frozen bit, a fixed frozen value is obtained through decoding.

In this solution, it should be understood that the cyclic shift feedback register is any one of a plurality of cyclic shift feedback registers (also referred to as cyclic feedback shift registers) corresponding to a preset polynomial. However, in specific use, once a cyclic shift feedback register corresponding to the polynomial is selected, the cyclic shift feedback register is unique in a processing procedure. The cyclic shift feedback register needs to be consistent with a cyclic shift feedback register used by the sending device.

Optionally, the cyclic shift feedback register is a CRC register.

Based on the foregoing solution, optionally, in the decoding process, when the to-be-decoded bit is an information bit, an information value obtained through decoding is filled into the cyclic shift feedback register corresponding to the polynomial, and the cyclic shift feedback register is updated based on the information value. This may be specifically implemented as follows: An assistant decoding sequence starts to be decoded from the least significant bit, and when each information value is filled, the information value is used as an input into the cyclic shift feedback register, so that the cyclic shift feedback register shifts from the most significant bit to the least significant bit.

In addition, in the decoding process, another possible implementation of updating the cyclic shift feedback register based on the information value is: starting to decode an assistant decoding sequence from a most significant bit, and when each information value is filled, using the information value as an input into the cyclic shift feedback register, so that the cyclic shift feedback register shifts from a least significant bit to the most significant bit.

In the foregoing decoding process, optionally, when the to-be-decoded bit is a CRC check bit, and the CRC check bit is interleaved with the frozen check bit, in other words, there is one or more CRC check bits before the frozen check bit, the receiving device updates the cyclic shift feedback register based on the value that is of the CRC check bit and that is obtained through decoding.

Based on any one of the foregoing solutions, optionally, when the to-be-decoded bit is a frozen check bit, the receiving device may further update the cyclic shift feedback register based on the value that is of the frozen check bit and that is obtained through decoding.

Based on any one of the foregoing solutions, optionally, when the to-be-decoded bit is a frozen bit, the cyclic shift feedback register is updated based on the fixed frozen value obtained through decoding.

Based on any one of the foregoing solutions, there is at least one frozen check bit, and a check value of each frozen check bit is a value of a bit in a cyclic shift process of the cyclic shift register, or a value of each frozen check bit is a preset value. The check value of the frozen check bit may be a value of a bit that is a most significant bit in the cyclic shift process of the cyclic shift register; or may be a value of any bit in the cyclic shift process of the cyclic shift register.

In the decoding process provided in any one of the foregoing solutions, when the to-be-decoded bit is a frozen check bit, the value of the bit in the cyclic shift process of the cyclic shift register is obtained from the cyclic shift register by using a multiplexer.

The value that is of the frozen check bit and that is obtained through decoding and the obtained check value of the frozen check bit are checked in at least the following several implementations:

Implementation 1: The receiving device checks the value that is of the frozen check bit and that is obtained through decoding and a check value that is of the frozen check bit and that is read from any bit in the cyclic shift feedback register. In other words, a specific bit in the cyclic shift feedback register is not limited. In the decoding process, the receiving device may read a value from any bit that is in the cyclic shift feedback register and that is pre-agreed on with the sending device, and check the value obtained through decoding and the value that is used as the value of the frozen check bit, provided that the values are consistent on the sending device side and the receiving device side.

Implementation 2: The receiving device checks the value that is of the frozen check bit and that is obtained through decoding and a check value that is of the frozen check bit and that is obtained from the cyclic shift feedback register by using the multiplexer.

In a specific implementation of the solution, there are specifically the following implementations in which the check value of the frozen check bit is obtained from the cyclic shift register by using the multiplexer: The receiving device checks the value that is of the frozen check bit and that is obtained through decoding and a check value that is of the frozen check bit and that is obtained by starting to sequentially read from the least significant bit in the cyclic shift feedback register by using the multiplexer; or checks the value that is of the frozen check bit and that is obtained through decoding and a check value that is of the frozen check bit and that is obtained by starting to sequentially read from the most significant bit in the cyclic shift feedback register by using the multiplexer; or checks the value that is of the frozen check bit and that is obtained through decoding and a check value that is of the frozen check bit and that is obtained by starting to sequentially read from the data input bit in the cyclic shift feedback register by using the multiplexer; or checks the value that is of the frozen check bit and that is obtained through decoding and a check value that is of the frozen check bit and that is obtained by starting to sequentially read from the preset bit in the cyclic shift feedback register by using the multiplexer; or checks the value that is of the frozen check bit and that is obtained through decoding and a check value that is of the frozen check bit and that is obtained from the cyclic shift feedback register in a pseudo-random form by using the multiplexer and an interleaved sequence.

A process in which a selected cyclic shift feedback register (for example, a CRC register) performs coding on a coding side is used as an example to describe the solutions provided in this application in the following.

A specific implementation of step 2 on a coding side in FIG. 5 may be described as follows:

Assistant bits include a $J_2'$-bit PC and a $(J+J_1')$-bit CRC, where J bits are used for error correction and error detection, $(J+J_1')$ bits are only used for error correction, and J, $J'_1$, and $J'_2$ are nonnegative integers. A unified coder of a sending device sequentially assigns values to a sequence b from a least significant bit to a most significant bit.

(1) For an information bit, an information value in a sequence a is filled, and a value in a CRC register is updated based on the information value.

If value assignment to the sequence a is completed, a current value in the CRC register is copied and used as a value copy of the register, and the CRC register is updated based on 0 for a quantity of times that is equal to a CRC length. Afterwards, a value in the CRC register is a CRC check value. After the value in the CRC register is stored, the current value in the CRC register is overwritten with the value copy of the register.

(2) For a CRC check bit, a CRC check value in a register is copied and is filled into the CRC check bit.

(3) For a frozen check bit, a value is obtained from a CRC register and is used as a value of the frozen check bit.

(4) For a frozen bit, a fixed frozen value such as 0 is filled.

This implementation may be implemented by using a plurality of types of program code, and this is not limited in this solution. The foregoing solution is described below by using a specific implementation. Pseudo code of this implementation is described as follows:

```
infoBitsCount=0;
register=0;
for(int i=0; i<B; ++i){
    if(b[i] is an information bit){
        if (infoBitsCount<K)
        {
            buff[i]=a[infoBitsCount];
        }
        b[i]=buff[infoBitsCount];
        ++infoBitsCount;
        Operation of a CRC register and updating of a value in the register
        if (infoBitsCount==infoLength)
        {
            crcCount=0;
            Generate a current copy of the CRC register;
            while (crcCount++<CRC length)
            {
                Input 0, and update the copy of the CRC register
            }
            tbit=1;
            for (unsigned int ii=0; ii<CRC length; ++ii){
                buff [infoBitsCount+ii]=the copy of the CRC register
                & tbit;
                tbit<<=1;
            }
        }
    }else if (b[i] is a dynamic frozen bit){
        b[i]=obtain a value in the CRC register;
    }
    else {
        frozen bit
    }
}
```

With reference to any one of the foregoing implementations, a structure and a specific implementation of the register are described by using a polynomial $X16+X12+X5+1$ as an example.

Figure 7:
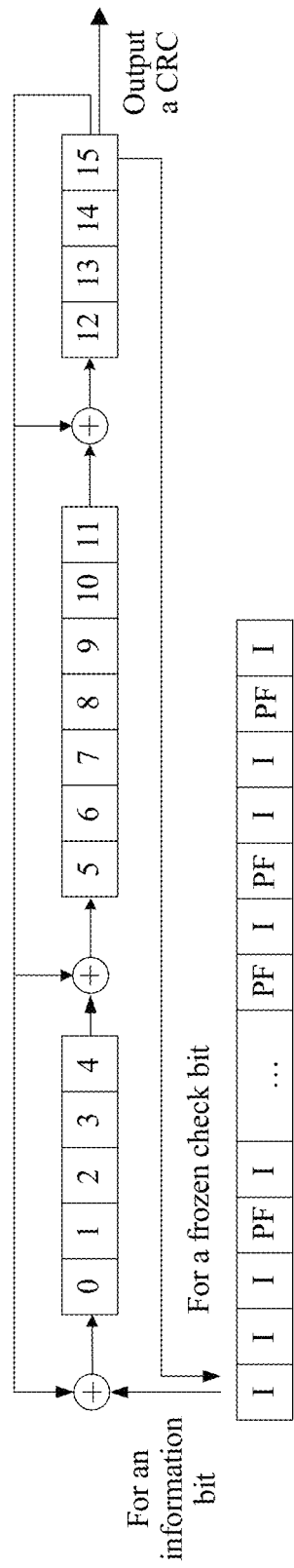
FIG. 7 is a schematic diagram of an information bit input into a CRC register according to an example of this application.

FIG. 7 is a schematic diagram of an information bit input into a CRC register according to an example of this application. A CRC polynomial $X16+X12+X5+1$ is used as an example. A structure of a CRC register corresponding to the polynomial is shown in FIG. 7. In a coding process, a to-be-input information bit starts to be input from a most significant bit. The CRC register cyclically shifts from a least significant bit to the most significant bit. When the information bit (represented as I in the figure) interacts with the CRC register, an exclusive OR (XOR) operation and shifting are performed; and when a frozen check bit (represented as PF in the figure) interacts with the CRC register, a value is obtained from the most significant bit (the 15th bit in the figure) in the CRC register.

The example CRC polynomial in FIG. 7 is corresponding to a plurality of CRC registers. During information transmission, a specific structure of a register may be pre-agreed on by a sending device and a receiving device; or a configuration in which any CRC register is selected as a register used in a coding process and a decoding process is provided in a sending device and a receiving device. In the coding process, the sending device performs coding from the most significant bit to the least significant bit (optionally, from the least significant bit to the most significant bit) based on the information bit. When a to-be-encoded bit is an information bit, a value of the information bit is used as an input into the register in FIG. 7, an exclusive OR operation is performed based on the structure of the register, and the register shifts forward, to be specific, the register shifts from the least significant bit to the most significant bit. When a to-be-encoded bit is a frozen check bit, a value is read from any location in the CRC register and is used as a value of the frozen check bit. In this solution, a value assignment operation is performed by reading the value from the most significant bit 15 in the CRC register and using the value as the frozen check value.

Figure 8:
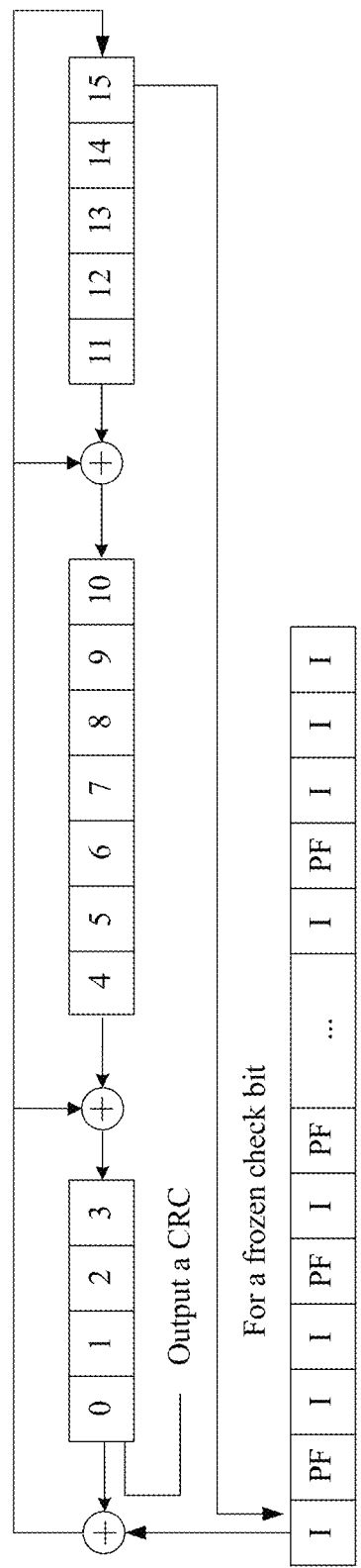
FIG. 8 is a schematic diagram of another information bit input into a CRC register according to an example of this application.

FIG. 8 is a schematic diagram of another information bit input into a CRC register according to an example of this application. An information bit starts to be input from a least significant bit, and the CRC register shifts from a most significant bit to the least significant bit. In this case, a CRC polynomial is an inverse form of an original polynomial. For example, an inverse form of X16+X12+X5+1 is X16+X10+X3+1. In this case, the CRC register is shown in FIG. 8. When the information bit (represented as I in the figure) interacts with the CRC register, an exclusive OR (XOR) operation and shifting are performed; and when a frozen check bit (represented as PF in the figure) interacts with the CRC register, a value is obtained from the most significant bit (15) in the CRC register. A difference from FIG. 7 is that in this solution, the information bit starts to be input from the least significant bit. When a to-be-encoded bit is an information bit, a value of the information bit is used as an input into the register in FIG. 8, an exclusive OR operation is performed based on a structure of the register, and the register shifts forward, in other words, shifts from the most significant bit to the least significant bit. When a to-be-encoded bit is a frozen check bit, a value is read from any location in the CRC register and is used as the frozen check value. In this solution, a value assignment operation is performed by reading the value from the most significant bit 15 in the CRC register and using the value as the frozen check value.

Figure 9:
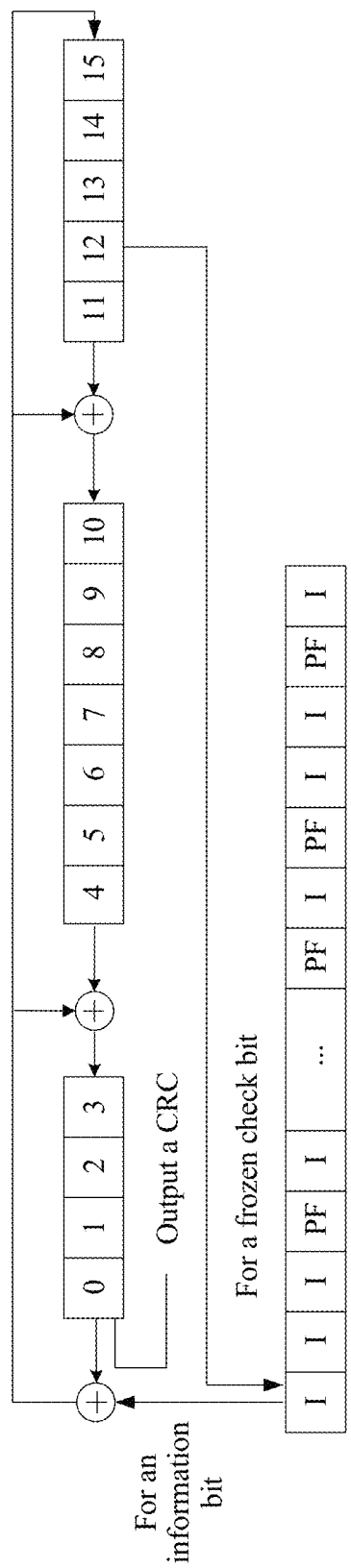
FIG. 9 is a schematic diagram of a frozen check bit input into a CRC register according to an example of this application.
Figure 10:
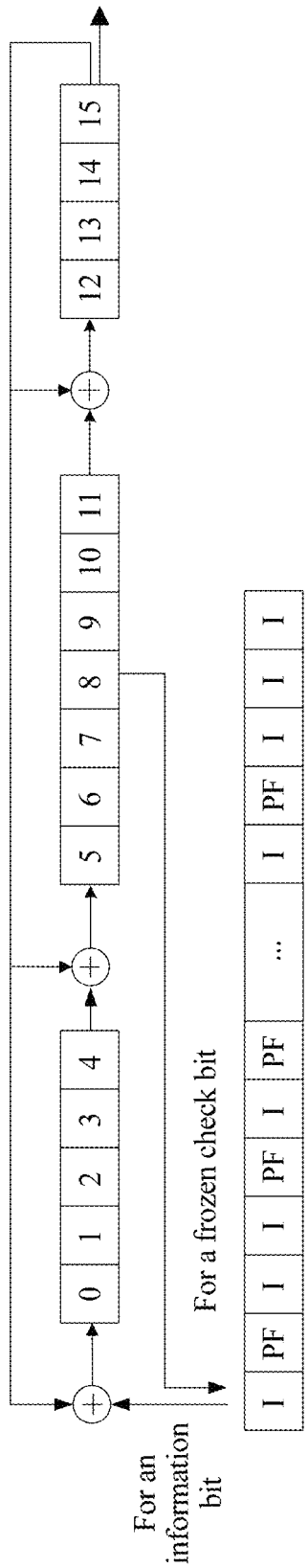
FIG. 10 is a schematic diagram of another frozen check bit input into a CRC register according to an example of this application.

FIG. 9 is a schematic diagram of a frozen check bit input into a CRC register according to an example of this application. FIG. 10 is a schematic diagram of another frozen check bit input into a CRC register according to an example of this application.

When a frozen check bit is encountered, a value of any fixed bit in the CRC register may be obtained from the CRC register. As shown in FIG. 9, the CRC register is defined by using an inverse CRC polynomial X16+X10+X3+1, and a value of the 12$^{th}$ bit in the register is permanently selected as a frozen check value.

Alternatively, as shown in FIG. 10, the CRC register is defined by using a CRC polynomial X16+X12+X5+1, and a value of the eighth bit in the register is permanently selected as a frozen check value.

Figure 11:
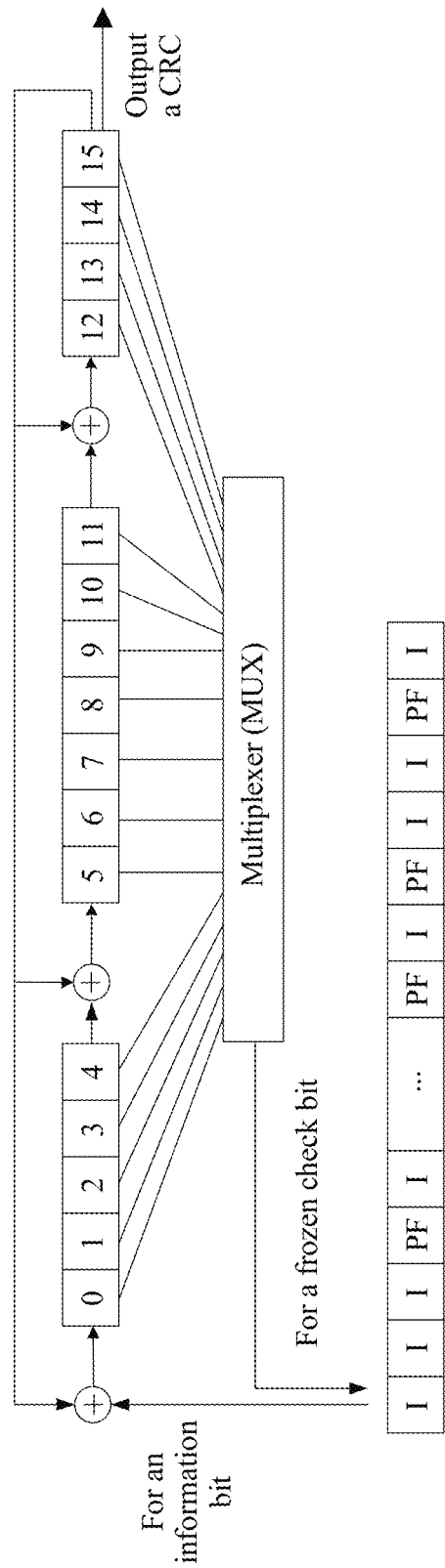
FIG. 11 is a schematic diagram of selecting a frozen check bit input into a CRC register by using a multiplexer according to an example of this application.

FIG. 11 is a schematic diagram of selecting a frozen check bit input into a CRC register by using a multiplexer according to an example of this application. In any one of the foregoing implementations, when a frozen check bit is encountered, a value in the CRC register is operated by using a multiplexer (Multiple User Experiment, MUX), and then is fed back to the frozen check bit.

The multiplexer may use without limitation to the following methods:

Round-robin starting from a least significant bit;
Round-robin starting from a most significant bit;
Round-robin starting from a data input location;
Round-robin starting from any fixed location; and
Using an interleaved sequence.

Round-robin may be expressed as follows: When a first bit that needs to be fed back is encountered, a value is obtained from a specified location in the register, and then a next value in the register is obtained in sequence (or in an inverse sequence) for a subsequent bit that needs to be fed back. If the most significant bit (Most Significant bit, MSB) (in the inverse sequence, the least significant bit (Least Significant Bit, LSB)) is encountered, a next location in the register is set to the LSB (in the inverse sequence, a next location in the register is set to the MSB).

The interleaved sequence is a sequence of selecting values from the register based on a sequence S, and S may be a pseudo-random sequence.

Figure 12:
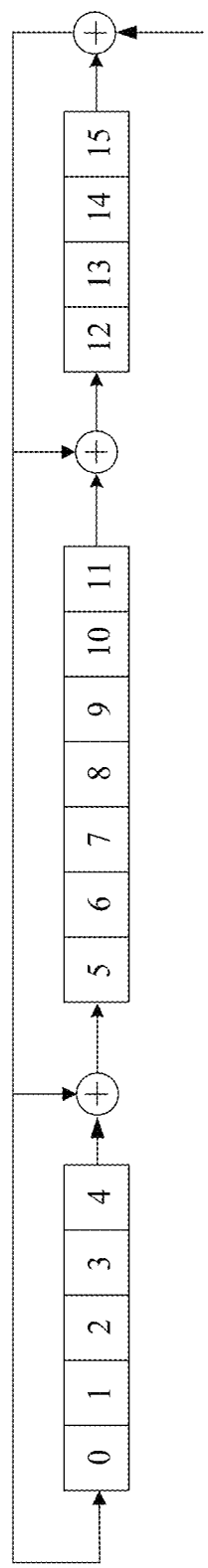
FIG. 12 to FIG. 14 are schematic diagrams of a general-purpose register according to an example of this application.
Figure 13:
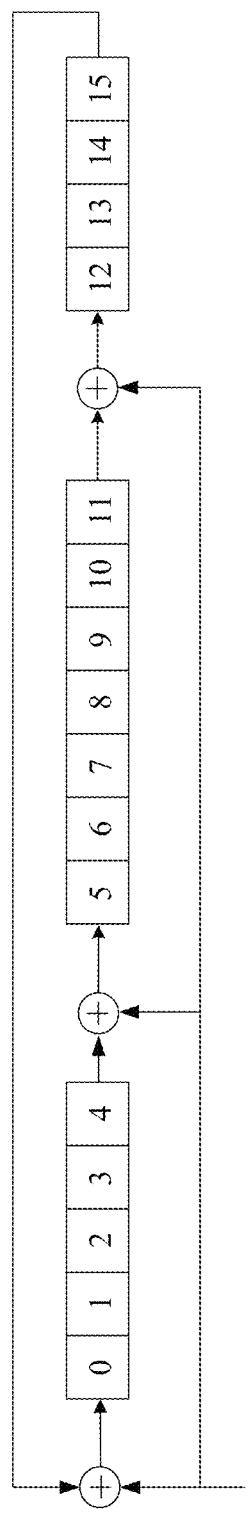
Figure 14:
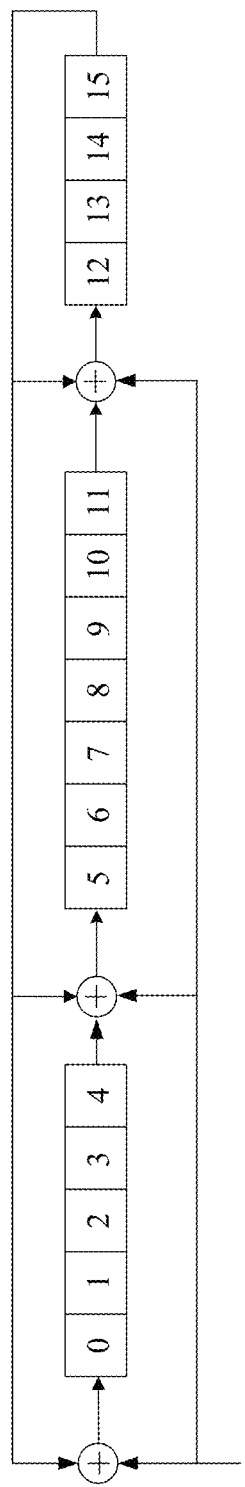

FIG. 12 to FIG. 14 are schematic diagrams of a general-purpose register according to an example of this application.

The CRC register in any one of the foregoing implementations may be a general-purpose polynomial register, and features of the CRC register may be described as follows:

A value of a most significant bit is input, the input value may be fed back, and a value of the most significant bit may be fed back to a non-least significant bit. A polynomial X16+X12+X5+1 is still used as an example, and an implementation form is shown in FIG. 12.

A value of a least significant bit is input, the input value may participate in an exclusive OR XOR operation, and a value of the most significant bit cannot be fed back to a non-least significant bit. A polynomial X16+X12+X5+1 is still used as an example, and an implementation form is shown in FIG. 13.

A value of a least significant bit is input, the input value may participate in an exclusive OR XOR operation, and a value of the most significant bit may be fed back to a non-least significant bit. A polynomial X16+X12+X5+1 is still used as an example, and an implementation form is shown in FIG. 14.

Figure 15:
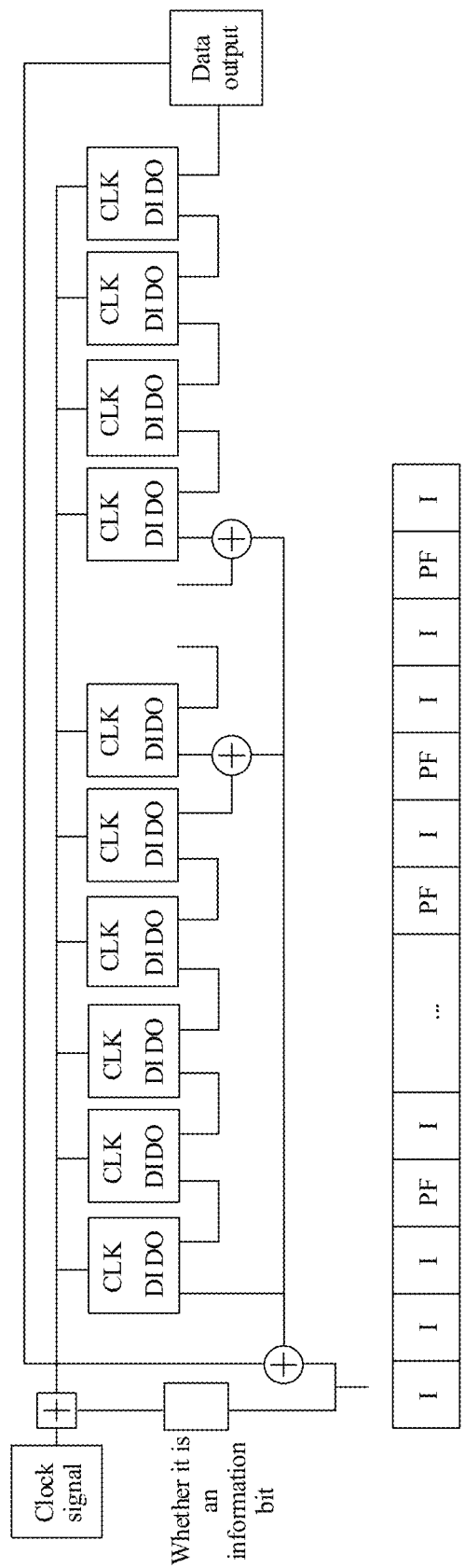
FIG. 15 is a schematic diagram of a shift signal generation apparatus of a register according to an example of this application.

FIG. 15 is a schematic diagram of a shift signal generation apparatus of a register according to an example of this application. For a structure of a polynomial register provided in any one of the foregoing implementations, shifting may occur only in a process of interaction with an information bit and a CRC bit. As shown in FIG. 15, a shifting action of the shift register needs to be triggered by a clock signal. A determining module first determines whether interaction data is an information bit. If the interaction data is an information bit, the clock signal normally passes through an AND (AND) gate, and a shifting operation of the shift register is triggered; or if the interaction data is not an information bit, the clock signal cannot pass through an AND gate, and the register performs no shifting operation.

Figure 16:
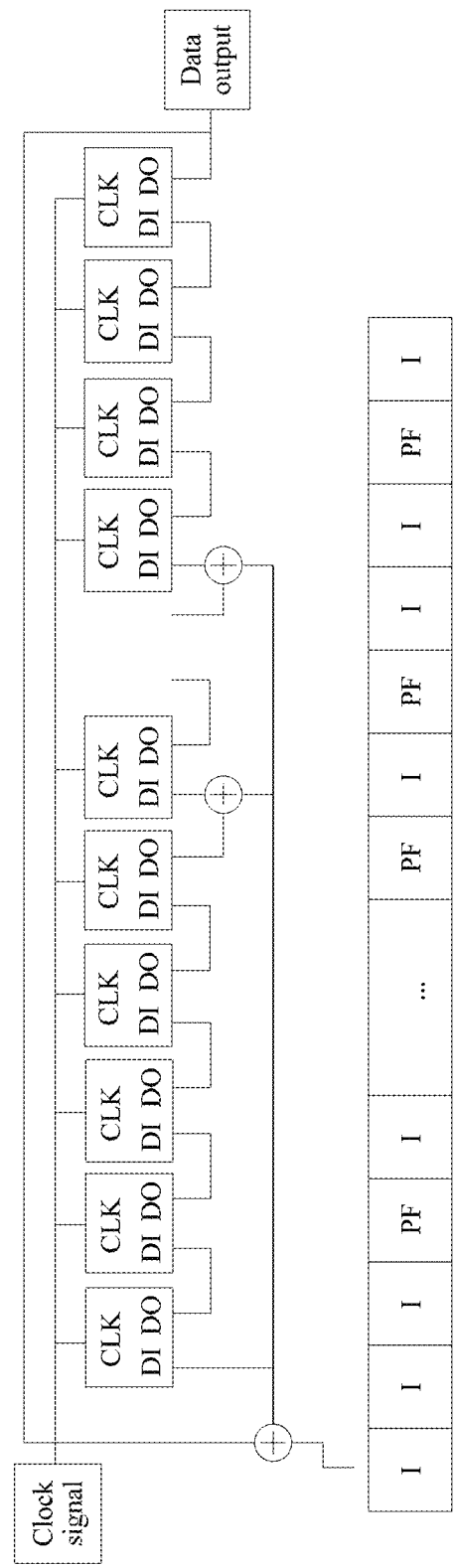
FIG. 16 is a schematic diagram of a shift signal generation apparatus of another register according to an example of this application.

FIG. 16 is a schematic diagram of a shift signal generation apparatus of another register according to an example of this application. A difference from the solution shown in FIG. 15 is that in this solution, in a coding process or a decoding process, a structure of the polynomial register shifts when the register interacts with any bit.

In any one of the foregoing implementations, for interaction with any bit, a shifting action is performed on the structure of the polynomial cyclic shift feedback register, for example, according to the solution in FIG. 16. When the polynomial cyclic shift feedback register interacts with an information bit, the information bit is input into an input location to participate in an exclusive OR operation.

When the polynomial cyclic shift feedback register mutually interacts with a frozen check bit, a value of a frozen bit is selected according to the foregoing solutions shown in FIG. 9 to FIG. 11, and the value is fed back to an input end of the polynomial cyclic shift feedback register to participate in an exclusive OR operation.

When the polynomial cyclic shift feedback register interacts with a frozen bit, 0 is input into the shift register, and participates in an exclusive OR operation.

Figure 17:
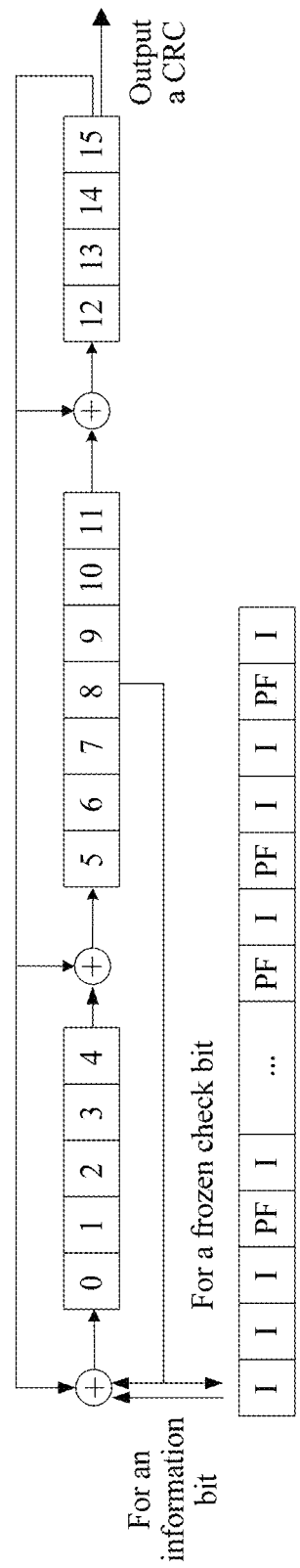
FIG. 17 is a schematic diagram of another frozen check bit input into a register according to an example of this application.

FIG. 17 is a schematic diagram of another frozen check bit input into a register according to an example of this application. As shown in FIG. 17, the eighth bit in the register is permanently selected as a value of a frozen check bit. When the frozen check bit interacts with a polynomial cyclic shift feedback register, a value of a fixed bit is filled into the frozen check bit, and participates in an exclusive OR operation of an input into the cyclic feedback shift register.

In any one of the foregoing solutions, a method for filling the frozen check bit is a distributed CRC generation method. For a corresponding decoding end, a manner of interaction with a polynomial register in a decoding process is similar to that on a coding side. To be specific, the distributed CRC may be used to perform an early check, to implement early path screening and early path termination.

It should be understood that, in any one of the foregoing implementations, a 16-bit register is used as an example to describe the coding method and the decoding method provided in this application. In actual application, a quantity of bits in the register may be 1 to infinity, and a commonly used coding register and a commonly used decoding register may be 16-bit to 24-bit cyclic feedback shift registers. In the coding method provided in this application, PC coding and CRC coding are uniformly performed by using a common CRC hardware resource, to simplify time complexity, space complexity, and calculation complexity of a coding algorithm, and implement parallel coding.

In the decoding method provided in this application, CRC decoding and a PC check are uniformly performed by using a common CRC hardware resource, to simplify space complexity, time complexity, and calculation complexity of a decoding algorithm, and reduce a decoding latency.

In addition, in a specific implementation, a CRC-polar code in which a CRC is used for error detection and error correction and a PC-polar code in which a CRC is only used for error detection and a PC is used only for error correction are used together, to not only implement early path screening and termination of polar decoding, but also ensure FAR performance of decoding. In addition, the PC is used to set an assistant check bit and a CRC register is used to generate check bit information, so that a distributed CRC can be quickly generated.

Figure 18:
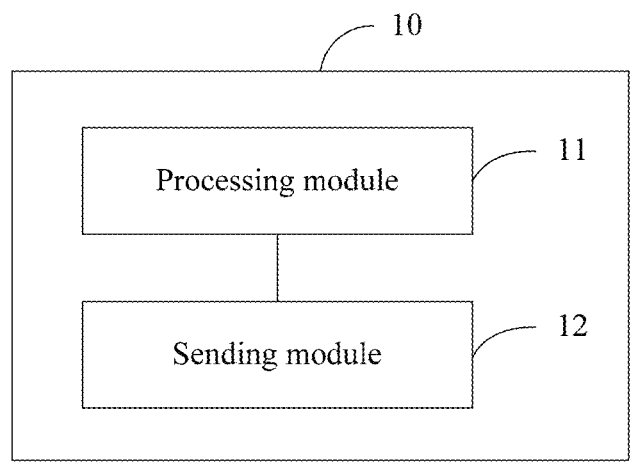
FIG. 18 is a schematic structural diagram of a coding apparatus according to this application.

FIG. 18 is a schematic structural diagram of a coding apparatus according to this application. As shown in FIG. 18, the coding apparatus 10 includes a processing module 11 and a sending module 12.

The processing module 11 is configured to obtain a to-be-encoded information bit sequence.

The processing module 11 is further configured to code the to-be-encoded information bit to obtain a coded bit sequence. The coded bit sequence includes the information bit, a frozen bit, a cyclic redundancy check CRC check bit, and a frozen check bit; and a value of the frozen check bit and a value of the CRC check bit are obtained by using a same cyclic shift register.

The processing module 11 is further configured to perform polar coding and rate matching on the coded bit sequence to obtain a to-be-sent rate-matched sequence.

The sending module 12 is configured to send the rate-matched sequence.

The coding apparatus provided in this embodiment is configured to implement the technical solutions on a sending device side in any one of the foregoing method embodiments. Implementation principles and technical effects thereof are similar. Details are not described herein again.

Based on the foregoing embodiment, the cyclic shift register is a CRC register.

Optionally, there is at least one frozen check bit, and a value of each frozen check bit is a value of a bit in a cyclic shift process of the cyclic shift register, or a value of each frozen check bit is a preset value.

Optionally, the processing module 11 is specifically configured to:

sequentially assign values to the coded bit sequence based on a location of the information bit, a location of the frozen bit, a location of the CRC check bit, and a location of the frozen check bit, where an operation is as follows:

when a to-be-encoded bit is an information bit, updating a value of a bit in the cyclic shift register based on a value of the information bit; or when a to-be-encoded bit is a CRC check bit, assigning, to the CRC check bit, a CRC check value obtained from the cyclic shift register; or when a to-be-encoded bit is a frozen check bit, assigning, to the frozen check bit, a value corresponding to a bit in the cyclic shift feedback register; or when a to-be-encoded bit is a frozen bit, assigning a fixed value to the frozen bit.

Optionally, when there is a CRC check bit before the frozen check bit, the processing module 11 is further configured to update the cyclic shift feedback register based on a value of the CRC check bit.

Optionally, the processing module 11 is specifically configured to:

update values of bits in the cyclic shift register in order from a most significant bit to a least significant bit based on the information bit; or update values of bits in the cyclic shift register in order from a least significant bit to a most significant bit based on the information bit.

Optionally, when the to-be-encoded bit is a frozen check bit, the processing module 11 is further configured to update a value of a bit in the cyclic shift feedback register based on a value of the frozen check bit.

Optionally, when the to-be-encoded bit is a frozen bit, the processing module 11 is further configured to update a value of a bit in the cyclic shift feedback register based on a value of the frozen bit.

Optionally, when the to-be-encoded bit is a frozen check bit, the value of the bit in the cyclic shift process of the cyclic shift register is obtained from the cyclic shift register by using a multiplexer. The coding apparatus provided in any one of the foregoing embodiments is configured to implement the technical solutions on the sending device side in any one of the foregoing method embodiments.

Implementation principles and technical effects thereof are similar. Details are not described herein again.

Figure 19:
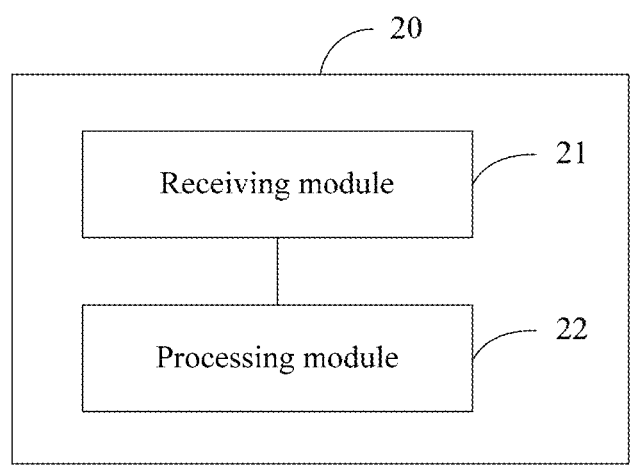
FIG. 19 is a schematic structural diagram of a decoding apparatus according to this application.

FIG. 19 is a schematic structural diagram of a decoding apparatus according to this application. As shown in FIG. 19, the decoding apparatus 20 includes:

a receiving module 21, configured to receive a rate-matched sequence; and a processing module 22, configured to perform rate de-matching processing on the rate-matched sequence to obtain a to-be-decoded sequence.

The processing module 22 is further configured to decode and check the to-be-decoded sequence to obtain an information bit sequence, where the to-be-decoded sequence includes an information bit, a frozen bit, a cyclic redundancy check CRC check bit, and a frozen check bit; and a check value of the frozen check bit and a check value of the CRC check bit are obtained by using a same cyclic shift register.

The decoding apparatus provided in this embodiment is configured to implement the technical solutions on a receiving device side in any one of the foregoing method embodiments. Implementation principles and technical effects thereof are similar. Details are not described herein again.

Based on the foregoing embodiment, the cyclic shift register is a CRC register.

Optionally, there is at least one frozen check bit, and a check value of each frozen check bit is a value of a bit in a cyclic shift process of the cyclic shift register, or a value of each frozen check bit is a preset value.

Optionally, the processing module 22 is specifically configured to:

sequentially perform polar decoding and a check on the to-be-decoded sequence in order from a least significant bit to a most significant bit based on a location of the information bit, a location of the frozen bit, a location of the CRC check bit, and a location of the frozen check bit, where an operation is as follows:

when a to-be-decoded bit is an information bit, updating a value of a bit in the cyclic shift register based on a value that is of the information bit and that is obtained through decoding; or when a to-be-decoded bit is a CRC check bit, checking a CRC check value obtained through decoding and a check value that is of the CRC bit and that is obtained from the cyclic shift register; or when a to-be-decoded bit is a frozen check bit, checking a value that is of the frozen check bit and that is obtained through decoding and an obtained check value of the frozen check bit, where the check value of the frozen check bit is a value corresponding to a bit in the cyclic shift feedback register; or when a to-be-decoded bit is a frozen bit, obtaining a fixed frozen value through decoding.

Optionally, when there is a CRC check bit before the frozen check bit, the processing module 22 is further configured to update the cyclic shift feedback register based on a value that is of the CRC check bit and that is obtained through decoding.

Optionally, the processing module 22 is specifically configured to update values of bits in the cyclic shift register by using values that are of information bits and that are obtained through decoding in order from a least significant bit to a most significant bit.

Optionally, when the to-be-decoded bit is a frozen check bit, the processing module 22 is further configured to update the cyclic shift feedback register based on the value that is of the frozen check bit and that is obtained through decoding.

Optionally, when the to-be-decoded bit is a frozen bit, the processing module 22 is further configured to update the cyclic shift feedback register based on the fixed frozen value obtained through decoding.

Optionally, when the to-be-decoded bit is a frozen check bit, the value of the bit in the cyclic shift process of the cyclic shift register is obtained from the cyclic shift register by using a multiplexer.

The decoding apparatus provided in any one of the foregoing embodiments is configured to implement the technical solution on the receiving device side according to any one of the foregoing method embodiments. Implementation principles and technical effects thereof are similar. Details are not described herein again.

It should be understood that, in an implementation of the foregoing coding apparatus or decoding apparatus, the processing module may be specifically implemented as a processor, the sending module may be implemented as a transmitter, and the receiving module may be implemented as a receiver.

This application further provides a sending device, including a memory, a processor, a transmitter, and a computer program. The computer program is stored in the memory, and the processor runs the computer program to perform the coding method provided in any one of the foregoing embodiments.

In a specific implementation of the sending device, there is at least one processor, and the processor is configured to execute an executable instruction, namely, the computer program, stored in the memory, so that the sending device exchanges data with a receiving device through a communications interface, to perform the coding method provided in any one of the foregoing implementations. Optionally, the memory may be further integrated into the processor.

This application further provides a receiving device, including a memory, a processor, receiver, and a computer program. The computer program is stored in the memory, and the processor runs the computer program to perform the decoding method provided in any one of the implementations.

In a specific implementation of the receiving device, there is at least one processor, and the processor is configured to execute an executable instruction, namely, the computer program, stored in the memory, so that the receiving device exchanges data with a sending device through a communications interface, to perform the decoding method provided in any one of the foregoing implementations. Optionally, the memory may be further integrated into the processor.

This application further provides a storage medium, including a readable storage medium and a computer program. The computer program is used to implement the coding method provided in any one of the foregoing embodiments.

This application further provides a storage medium, including a readable storage medium and a computer program. The computer program is used to implement the decoding method provided in any one of the foregoing embodiments.

This application further provides a program product, the program product includes a computer program (namely, an executable instruction), and the computer program is stored in a readable storage medium. At least one processor of a sending device may read the computer program from the readable storage medium, and the at least one processor executes the computer program, so that the sending device implements the coding method provided in the foregoing implementations.

This application further provides a program product, the program product includes a computer program (namely, an executable instruction), and the computer program is stored in a readable storage medium. At least one processor of a receiving device may read the computer program from the readable storage medium, and the at least one processor executes the computer program, so that the receiving device implements the decoding method provided in the foregoing implementations.

In a specific implementation of the sending device or the receiving device, it should be understood that the processor may be a central processing unit (English: Central Processing Unit, CPU for short), or may be another general-purpose processor, a digital signal processor (English: Digital Signal Processor, DSP for short), an application-specific integrated circuit (English: Application Specific Integrated Circuit, ASIC for short), or the like. The general-purpose processor may be a microprocessor, or the processor may be any conventional processor, or the like. The steps of the methods disclosed with reference to this application may be directly implemented by a hardware processor, or may be implemented by a combination of hardware in the processor and a software module.

All or some of the steps in the foregoing method embodiments may be implemented by a program instructing related hardware. The foregoing program may be stored in a readable memory. When the program is executed, the steps in the method embodiments are performed. The memory (storage medium) includes: a read-only memory (English: read-only memory, ROM for short), a RAM, a flash memory, a hard disk, a solid state disk, a magnetic tape (English: magnetic tape), a floppy disk (English: floppy disk), an optical disc (English: optical disc), and any combination thereof.

Finally, it should be noted that the foregoing embodiments are merely intended for describing the technical solutions of this application, rather than limiting this application.

The invention claimed is:

1. A coding method, comprising:
obtaining a to-be-encoded information bit sequence;
encoding the to-be-encoded information bit sequence to obtain an encoded bit sequence, wherein the encoded bit sequence comprises an information bit, a frozen bit, a cyclic redundancy check (CRC) bit, and a frozen check bit, wherein a value of the frozen check bit and a value of the CRC bit are obtained through a same cyclic shift register;
performing polar coding and rate matching on the encoded bit sequence to obtain a to-be-sent rate-matched sequence; and
sending the rate-matched sequence.

2. The method according to claim 1, wherein the encoded bit sequence comprises at least one frozen check bit, and a value of each of the at least one frozen check bit is a value of a bit in a cyclic shift process of the cyclic shift register or a preset value.

3. The method according to claim 1, wherein encoding the to-be-encoded information bit sequence comprises:
sequentially assigning values to the encoded bit sequence based on a location of the information bit, a location of the frozen bit, a location of the CRC bit, and a location of the frozen check bit, by performing one or more operations comprising:
when a to-be-encoded bit in the to-be-decoded sequence is an information bit, updating a value of a bit in the cyclic shift register based on a value of the information bit; or
when a to-be-encoded bit in the to-be-decoded sequence is a CRC bit, assigning, to the CRC bit, a CRC value obtained from the cyclic shift register; or
when a to-be-encoded bit in the to-be-decoded sequence is a frozen check bit, assigning, to the frozen check bit, a value corresponding to a bit in the cyclic shift register; or
when a to-be-encoded bit in the to-be-decoded sequence is a frozen bit, assigning a fixed value to the frozen bit.

4. A decoding method, comprising:
receiving a rate-matched sequence;
rate de-matching on the rate-matched sequence to obtain a to-be-decoded sequence; and
decoding and checking the to-be-decoded sequence to obtain an information bit sequence, wherein the to-be-decoded sequence comprises an information bit, a frozen bit, a cyclic redundancy check (CRC) bit, and a frozen check bit, wherein a check value of the frozen check bit and a check value of the CRC bit are obtained through a same cyclic shift register.

5. The method according to claim 4, wherein the encoded bit sequence comprises at least one frozen check bit, and a check value of each of the at least one frozen check bit is a value of a bit in a cyclic shift process of the cyclic shift register or a preset value.

6. The method according to claim 4, wherein the decoding and checking the to-be-decoded sequence to obtain an information bit sequence comprises:
sequentially performing polar decoding and checking on the to-be-decoded sequence in an order from a least significant bit to a most significant bit based on a location of the information bit, a location of the frozen bit, a location of the CRC bit, and a location of the frozen check bit, by performing one or more operations comprising:
when a to-be-decoded bit in the to-be-decoded sequence is an information bit, updating a value of a bit in the cyclic shift register based on a value of the information bit obtained through decoding; or
when a to-be-decoded bit in the to-be-decoded sequence is a CRC bit, checking a CRC value obtained through decoding against a check value of the CRC bit obtained from the cyclic shift register; or
when a to-be-decoded bit in the to-be-decoded sequence is a frozen check bit, checking a decoded value of the frozen check bit against an obtained check value of the frozen check bit, wherein the decoded value of the frozen check bit is obtained through decoding and the obtained check value of the frozen check bit is a value corresponding to a bit in the cyclic shift register; or
when a to-be-decoded bit in the to-be-decoded sequence is a frozen bit, obtaining a fixed frozen value through decoding.

7. A device, comprising a memory, a processor, a transmitter, and a computer program, wherein the computer program is stored in the memory, and the processor is configured to:
obtain a to-be-encoded information bit sequence;
encode the to-be-encoded information bit sequence to obtain an encoded bit sequence, wherein the encoded bit sequence comprises an information bit, a frozen bit, a cyclic redundancy check (CRC) bit, and a frozen check bit, wherein a value of the frozen check bit and a value of the CRC bit are obtained through a same cyclic shift register; and
perform polar coding and rate matching on the encoded bit sequence to obtain a to-be-sent rate-matched sequence.

8. The device according to claim 7, wherein the encoded bit sequence comprises at least one frozen check bit, and a value of each of the at least one frozen check bit is a value of a bit in a cyclic shift process of the cyclic shift register or a preset value.

9. The device according to claim 7, wherein encoding the to-be-encoded information bit sequence comprises:
sequentially assigning values to the encoded bit sequence based on a location of the information bit, a location of the frozen bit, a location of the CRC bit, and a location of the frozen check bit, by performing one or more operations comprising:
when a to-be-encoded bit in the to-be-decoded sequence is an information bit, updating a value of a bit in the cyclic shift register based on a value of the information bit; or
when a to-be-encoded bit in the to-be-decoded sequence is a CRC bit, assigning, to the CRC bit, a CRC value obtained from the cyclic shift register; or
when a to-be-encoded bit in the to-be-decoded sequence is a frozen check bit, assigning, to the frozen check bit, a value corresponding to a bit in the cyclic shift register; or
when a to-be-encoded bit in the to-be-decoded sequence is a frozen bit, assigning a fixed value to the frozen bit.

10. A device, comprising a memory, a processor, a receiver, and a computer program, wherein the computer program is stored in the memory, and the processor is configured to:
receive a rate-matched sequence;
rate de-match on the received rate-matched sequence to obtain a to-be-decoded sequence; and
decode and check the to-be-decoded sequence to obtain an information bit sequence, wherein the to-be-decoded sequence comprises an information bit, a frozen bit, a cyclic redundancy check (CRC) check bit, and a frozen check bit, wherein a check value of the frozen check bit and a check value of the CRC bit are obtained through a same cyclic shift register.

11. The device according to claim 10, wherein the to-be-decoded sequence comprises at least one frozen check bit, and a check value of each of the at least one frozen check bit is a value of a bit in a cyclic shift process of the cyclic shift register or a preset value.

12. The device according to claim 10, wherein the processor is further configured to:
sequentially perform polar decoding and checking on the to-be-decoded sequence in an order from a least significant bit to a most significant bit based on a location of the information bit, a location of the frozen bit, a location of the CRC bit, and a location of the frozen check bit, by performing one or more operations comprising:
when a to-be-decoded bit in the to-be-decoded sequence is an information bit, updating a value of a bit in the cyclic shift register based on a value of the information bit obtained through decoding; or
when a to-be-decoded bit in the to-be-decoded sequence is a CRC bit, checking a CRC value obtained through decoding against a check value of the CRC bit obtained from the cyclic shift register; or
when a to-be-decoded bit in the to-be-decoded sequence is a frozen check bit, checking a decoded value of the frozen check bit against an obtained check value of the frozen check bit, wherein the decoded value of the frozen check bit is obtained through decoding and the obtained check value of the frozen check bit is a value corresponding to a bit in the cyclic shift register; or
when a to-be-decoded bit in the to-be-decoded sequence is a frozen bit, obtaining a fixed frozen value through decoding.

* * * * *